(12) United States Patent
Park et al.

(10) Patent No.: US 10,593,734 B2
(45) Date of Patent: Mar. 17, 2020

(54) DISPLAY DEVICE HAVING BOUNDARY WITH REDUCED ALIASING EFFECT

(71) Applicant: Samsung Display Co., Ltd., Yongin-si (KR)

(72) Inventors: Dae Ki Park, Seoul (KR); Tae Jong Jun, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/049,815

(22) Filed: Jul. 31, 2018

(65) Prior Publication Data

US 2019/0198579 A1    Jun. 27, 2019

(30) Foreign Application Priority Data

Dec. 27, 2017   (KR) .................... 10-2017-0181388

(51) Int. Cl.
| | |
|---|---|
| *H01L 27/32* | (2006.01) |
| *H01L 51/52* | (2006.01) |
| *G02F 1/1335* | (2006.01) |
| *G09G 3/20* | (2006.01) |
| *G02F 1/1368* | (2006.01) |
| *G09G 3/36* | (2006.01) |
| *G09G 3/3266* | (2016.01) |

(Continued)

(52) U.S. Cl.
CPC .... *H01L 27/3213* (2013.01); *G02F 1/133512* (2013.01); *G09G 3/2003* (2013.01); *H01L 27/3218* (2013.01); *H01L 51/5284* (2013.01); *G02F 1/1368* (2013.01); *G02F 2201/52* (2013.01); *G02F 2201/56* (2013.01); *G09G 3/3233* (2013.01); *G09G 3/3266* (2013.01); *G09G 3/3275* (2013.01); *G09G 3/3677* (2013.01); *G09G 3/3688* (2013.01); *G09G 2300/0452* (2013.01); *G09G 2310/08* (2013.01); *H01L 27/3244* (2013.01)

(58) Field of Classification Search
CPC combination set(s) only.
See application file for complete search history.

(56) References Cited

U.S. PATENT DOCUMENTS

| | | | |
|---|---|---|---|
| 8,345,209 B2 | 1/2013 | Fujita | |
| 10,153,331 B1 * | 12/2018 | Jun | ..................... H01L 27/3218 |

(Continued)

FOREIGN PATENT DOCUMENTS

| | | |
|---|---|---|
| JP | 2006-276580 | 10/2006 |
| JP | 5112961 | 1/2013 |

*Primary Examiner* — Nduka E Ojeh
(74) *Attorney, Agent, or Firm* — H.C. Park & Associates, PLC

(57) ABSTRACT

A display device may include: a display area; a peripheral area which is located outside the display area and in which a black matrix is disposed; and a plurality of pixel columns including: a first pixel column including a first pixel configured to display a first color; and a second pixel column including a second pixel configured to display a second color different from the first color, wherein an absolute value of a first boundary slope of a boundary line between the first pixel column and the black matrix may be greater than an absolute value of a second boundary slope of a boundary line between the second pixel column and the black matrix, and wherein the first color may be one of white and green.

15 Claims, 26 Drawing Sheets

(51) Int. Cl.
*G09G 3/3275* (2016.01)
*G09G 3/3233* (2016.01)

(56) References Cited

U.S. PATENT DOCUMENTS

| | | | | |
|---|---|---|---|---|
| 2009/0309813 A1* | 12/2009 | Fujita | ................ | G02F 1/133512 345/55 |
| 2016/0035265 A1* | 2/2016 | Park | .................... | G09G 3/2003 345/694 |
| 2019/0088709 A1* | 3/2019 | Zeng | .................. | H01L 27/1218 |

* cited by examiner

DISPLAY DEVICE HAVING BOUNDARY WITH REDUCED ALIASING EFFECT

CROSS-REFERENCE TO RELATED APPLICATION

This application claims priority from and the benefit of Korean Patent Application No. 10-2017-0181388, filed on Dec. 27, 2017, which is hereby incorporated by reference for all purposes as if fully set forth herein.

BACKGROUND

Field

Exemplary embodiments/implementations of the invention relate generally to a display device.

Discussion of the Background

With the development of multimedia, display devices are becoming increasingly important. Accordingly, various types of display devices such as liquid crystal displays (LCDs) and organic light-emitting displays are being used.

For example, an LCD includes a pair of substrates having a field generating electrodes, such as pixel electrodes and a common electrode, and a liquid crystal layer interposed between the two substrates. In the LCD, voltages are applied to the field generating electrodes to generate an electric field in the liquid crystal layer. Accordingly, the direction of liquid crystal molecules of the liquid crystal layer is determined, and the polarization of incident light is controlled. As a result, a desired image is displayed on the LCD.

In another example, organic light-emitting displays display an image using an organic light-emitting diode (OLED) that generates light through recombination of electrons and holes. Such organic light-emitting displays have the advantages of fast response speed, high luminance, wide viewing angle, and low power consumption.

The above information disclosed in this Background section is only for understanding of the background of the inventive concepts, and, therefore, it may contain information that does not constitute prior art.

SUMMARY

A display according to exemplary embodiments of the invention may realize a perceived boundary line on a display with reduced aliasing effect perceived by the user.

According to one or more embodiments of the invention, a display device may include: a display area; a peripheral area which is located outside the display area and in which a black matrix is disposed; and a plurality of pixel columns including: a first pixel column including a first pixel configured to display a first color; and a second pixel column including a second pixel configured to display a second color different from the first color, wherein an absolute value of a first boundary slope of a boundary line between the first pixel column and the black matrix may be greater than an absolute value of a second boundary slope of a boundary line between the second pixel column and the black matrix, and wherein the first color may be one of white and green.

The first pixel column may further include a third pixel configured to display a third color, and wherein the third color may be one of white and green and different from the first color.

The second color may be red.

The second pixel column may further include a fourth pixel configured to display a fourth color, and wherein the fourth color may be blue.

At least a part of the first pixel of the first pixel column disposed in the peripheral area may not overlap the black matrix.

The display area and the peripheral area may be separated by an imaginary boundary line, and an absolute value of a slope of a normal line at which the first pixel column and the imaginary boundary line meet may be smaller than the absolute value of the first boundary slope.

The second pixel of the second pixel column disposed in the peripheral area may completely overlap the black matrix.

The display area and the peripheral area may be separated by the imaginary boundary line, and an absolute value of a slope of a normal line at which the second pixel column and the imaginary boundary line meet may be greater than or equal to the absolute value of the second boundary slope.

The display area may be circular.

According to one or more exemplary embodiments of the invention, a display device may include: a display area; a peripheral area disposed outside the display area and separated from the display area by an imaginary boundary line; a black matrix disposed in the peripheral area; and a plurality of pixel columns including: a first pixel column including a first pixel configured to display a first color; and a second pixel column including a second pixel configured to display a second color different from the first color, wherein an absolute value of a first boundary slope of a boundary line between the first pixel column and the black matrix may be greater than an absolute value of a second boundary slope of a boundary line between the second pixel column and the black matrix, and wherein an absolute value of a slope of a normal line at which the first pixel column and the imaginary boundary line meet may be smaller than the first boundary slope.

An absolute value of a slope of a normal line at which the second pixel column and the imaginary boundary line meet may be greater than or equal to the absolute value of the second boundary slope.

The first color may be one of white and green, and the second color may be one of red and blue.

The absolute value of the first boundary slope may be greater than the absolute value of the second boundary slope.

At least a part of the first pixel of the first pixel column disposed in the peripheral area may not overlap the black matrix.

The second pixel of the second pixel column disposed in the peripheral area may completely overlap the black matrix.

According to one or more exemplary embodiments of the invention, a display device may include: a display area; a peripheral area disposed outside the display area and separated from the display area by an imaginary boundary line; a black matrix disposed in the peripheral area; and a plurality of pixel columns including: a first pixel column including a first pixel configured to display a first color; and a second pixel column including a second pixel configured to display a second color different from the first color, wherein the first pixel of the first pixel column disposed in the peripheral area may not overlap the black matrix, and wherein the first color may be one of white and green.

The second color may be one of blue and red.

An absolute value of a first boundary slope of a boundary line between the first pixel column and the black matrix may be greater than an absolute value of a second boundary slope of a boundary line between the second pixel column and the black matrix.

An absolute value of a slope of a normal line at which the first pixel column and the imaginary boundary line meet may be smaller than the absolute value of the first boundary slope.

An absolute value of a slope of a normal line at which the second pixel column and the imaginary boundary line meet may be greater than the absolute value of or equal to the second boundary slope.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
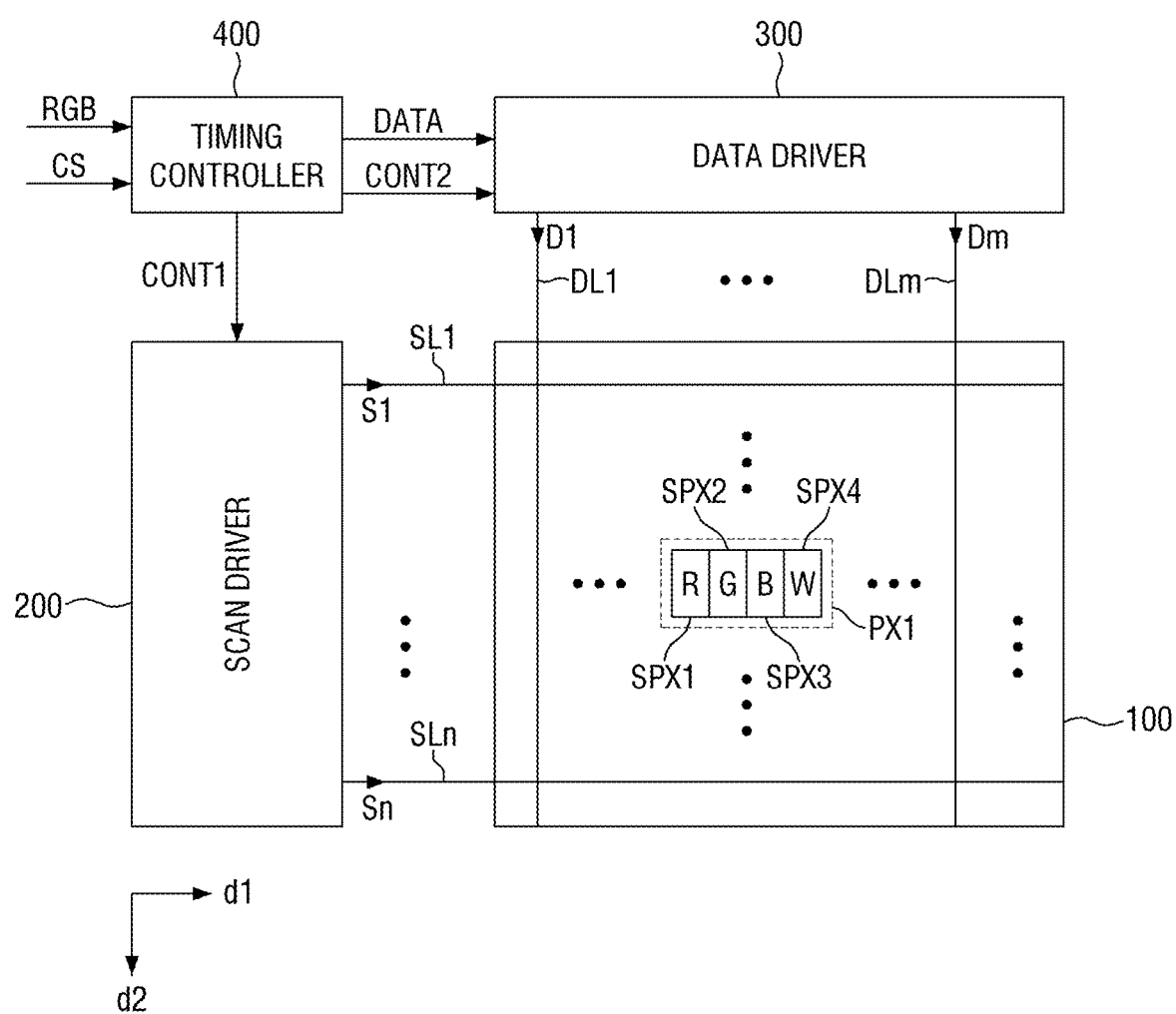
FIG. 1 is a schematic block diagram of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic block diagram of a display device according to an exemplary embodiment.

Referring to FIG. 1, the display device according to the exemplary embodiment may include a display unit 100, a scan driver 200, a data driver 300, and a timing controller 400.

The display unit 100 is an area for displaying an image. The display unit 100 may include a plurality of pixels including a first pixel PX1. The plurality of pixels may be disposed in areas defined by first through $n^{th}$ scan lines SL1 through SLn (where n is a natural number of 1 or greater) extending in a first direction d1 and first through $m^{th}$ data lines DL through DLm (where m is a natural number of 1 or greater) extending in a second direction d2. Here, the first direction d1 may intersect the second direction d2. Based on FIG. 1, the first direction d1 may be defined as a row direction, and the second direction d2 may be defined as a column direction.

The first pixel PX1 may include first through fourth subpixels SPX1, SPX2, SPX3, and SPX4. The first through fourth subpixels SPX1, SPX2, SPX3, and SPX4 may neighbor each other along the first direction d1. The first through fourth subpixels SPX1, SPX2, SPX3, and SPX4 may receive data signals from different data lines, respectively. In addition, the first through fourth subpixels SPX1, SPX2, SPX3, and SPX4 may receive the same scan signal from the same scan line.

The first through fourth subpixels SPX1, SPX2, SPX3, and SPX4 may display different colors. For example, each of the first through fourth subpixels SPX1, SPX2, SPX3, and SPX4 may display one of red, green, blue, and white. According to the exemplary embodiment illustrated in FIG. 1, the first subpixel SPX1 may display red, the second subpixel SPX2 may display green, the third subpixel SPX3 may display blue, and the fourth subpixel SPX4 may display white.

The scan driver 200 may be electrically connected to the plurality of pixels by the first through $n^{th}$ scan lines SL1 through SLn. More specifically, the scan driver 200 may generate first through $n^{th}$ scan signals S1 through Sn and provide the generated first through $n^{th}$ scan signals S1 through Sn to the plurality of pixels through the first through $n^{th}$ scan lines SL1 through SLn. Here, the scan driver 200 may generate the first through $n^{th}$ scan signals S1 through Sn based on a first control signal CONT1 received from the timing controller 400. In an exemplary embodiment, the scan driver 200 may include a plurality of transistors that generate the first through the $n^{th}$ scan signals S1 through Sn. In an exemplary embodiment, the scan driver 200 may include an integrated circuit that generates the first through the $n^{th}$ scan signals S1 through Sn.

The data driver 300 may be electrically connected to the plurality of pixels by the first through $m^{th}$ data lines DL1 through DLm. More specifically, the data driver 300 may generate first through $m^{th}$ data signals D1 through Dm and output the generated first through $m^{th}$ data signals D1 through Dm to the plurality of pixels through the first through $m^{th}$ data lines DL1 through DLm. The data driver 300 may include a shift register, a latch, and a digital-analog converter in an exemplary embodiment.

The data driver 300 may receive a second control signal CONT2 and image data DATA from the timing controller 400. In an exemplary embodiment, the data driver 300 may convert the image data DATA, which is in a digital waveform, into the first through $m^{th}$ data signals D1 through Dm, which are in an analog form, based on the second control signal CONT2. The data driver 300 may provide the first through the $m^{th}$ data signals D1 through Dm to corresponding pixels selected by the first through $n^{th}$ scan signals S1 through Sn among the plurality of pixels.

The timing controller 400 may receive an image signal RGB and a control signal CS from an external source. The image signal RGB may include a plurality of gray data corresponding to data signals to be provided to the plurality of pixels. According to the exemplary embodiment, the control signal CS may include a vertical synchronization signal, a horizontal synchronization signal, a main clock signal, and a data enable signal. The timing controller 400 may process signals received from the external source according to the operating conditions of the display unit 100 and then generate the image data DATA, the first control signal CONT1, and the second control signal CONT2.

The timing controller 400 may provide the generated first control signal CONT1 to the scan driver 200. The first control signal CONT1 may include a scan start signal for instructing the start of output of the first through $n^{th}$ scan signals S1 through Sn and a gate clock signal for controlling the output timing of a scan on pulse. In addition, the timing controller 400 may provide the generated second control signal CONT2 to the data driver 300. The second control signal CONT2 may include a horizontal synchronization start signal for instructing the start of input of the image data DATA and a load signal for controlling the transmission of the first through $m^{th}$ data signals D1 through Dm.

In exemplary embodiments, the scan driver 200, the data driver 300, and the timing controller 400, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the scan driver 200, the data driver 300, and the timing controller 400, and/or one or more components thereof may include or otherwise be associated with one or more memories (not shown) including code (e.g., instructions) configured to cause the scan driver 200, the data driver 300, and the timing controller 400, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Figure 2:
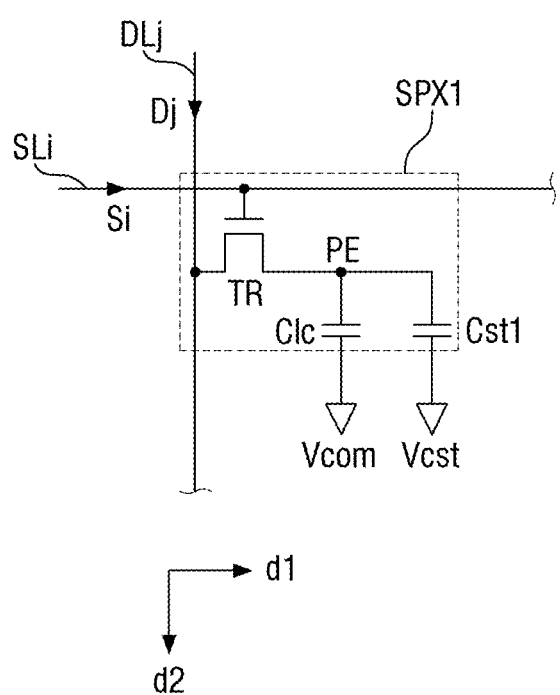
FIG. 2 is an equivalent circuit diagram of an exemplary embodiment of a first subpixel illustrated in FIG. 1.

With reference to FIG. 2, an exemplary embodiment of a subpixel will hereinafter be described based on the first subpixel SPX1.

FIG. 2 is an equivalent circuit diagram of an exemplary embodiment of the first subpixel SPX1 illustrated in FIG. 1. In FIG. 2, the first subpixel SPX1 is connected to a $j^{th}$ data line DLj (where j is a natural number of 1 or greater) and an $i^{th}$ scan line SLi (where i is a natural number of 1 or greater).

Referring to FIG. 2, the first subpixel SPX1 may include a switching element TR, a pixel electrode PE, a liquid crystal capacitor $C1c$, and a first storage capacitor Cst1.

The switching element TR may be connected to the $i^{th}$ scan line SLi, the $j^{th}$ data line DLj, and the pixel electrode PE. In an exemplary embodiment, the switching element TR may be a three-terminal element such as a thin-film transistor. The switching element TR will hereinafter be described as a thin-film transistor. The switching element TR may have a gate electrode connected to the $i^{th}$ scan line SLi and a source electrode connected to the $j^{th}$ data line DLj. A drain electrode of the switching element TR may be connected to the pixel electrode PE.

The switching element TR may be turned on in response to an $i^{th}$ scan signal Si received from the $i^{th}$ scan line SLi and provide a $j^{th}$ data signal Dj received from the $j^{th}$ data line DLj to the pixel electrode PE.

The pixel electrode PE may be capacitively coupled to a common electrode provided with a common voltage Vcom.

Accordingly, the liquid crystal capacitor C1c may be formed between the pixel electrode PE and the common electrode. That is, when the display unit 100 illustrated in FIG. 1 includes the first subpixel SPX1 illustrated in FIG. 2, the display device according to the exemplary embodiment may be a liquid crystal display (LCD).

The first storage capacitor Cst1 may have an electrode electrically connected to the pixel electrode PE and the other electrode electrically connected to a storage electrode provided with a storage voltage Vcst.

The first subpixel SPX1 is not limited to the one illustrated in FIG. 2. According to the exemplary embodiments, the first subpixel SPX1 may further include at least one switching element for improving visibility, in addition to the switching element TR.

Figure 3:
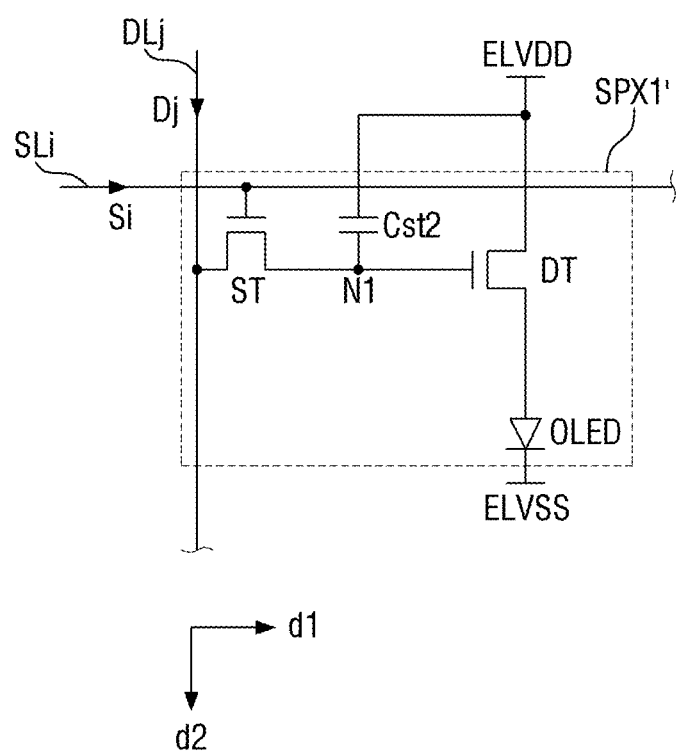
FIG. 3 is an equivalent circuit diagram of an exemplary embodiment of the first subpixel illustrated in FIG. 1.

FIG. 3 is an equivalent circuit diagram of another exemplary embodiment of the first subpixel SPX1 illustrated in FIG. 2. For simplicity, a description of elements and features substantially identical to those described above with reference to FIG. 2 will be omitted. In FIG. 3, the first subpixel SPX1 will be indicated by SPX1' in order to distinguish the first subpixel PX1' from the first subpixel SPX1 described in FIG. 2.

Referring to FIG. 3, the first subpixel SPX1' may include a first switching element ST, a second switching element DT, a second storage capacitor Cst2, and an organic light-emitting diode OLED. That is, when the display unit 100 illustrated in FIG. 1 includes the first subpixel SPX1' illustrated in FIG. 3, the display device according to the exemplary embodiment may be an organic light-emitting display. In this case, the display device illustrated in FIG. 1 may further include a power supply unit that provides a first driving voltage ELVDD and a second driving voltage ELVSS to the display unit 100.

The first switching element ST may include a source electrode electrically connected to the $j^{th}$ data line DLj, a drain electrode electrically connected to a first node N1, and a gate electrode electrically coupled to the $i^{th}$ scan line SLi. Here, the first node N1 may be electrically connected to a gate electrode of the second switching element DT and an electrode of the second storage capacitor Cst2. The first switching element ST may be turned on in response to the $i^{th}$ scan signal Si received from the $i^{th}$ scan line SLi and provide the $j^{th}$ data signal Dj received from the $j^{th}$ data line DLj to the first node N1.

The second storage capacitor Cst2 may include an electrode electrically connected to the first node N1 and the other electrode provided with the first driving voltage ELVDD. The second storage capacitor Cst2 may be charged with a voltage corresponding to a difference in voltage level between a voltage provided to the first node N1 and the first driving voltage ELVDD.

The second switching element DT may include a source electrode provided with the first driving voltage ELVDD, a drain electrode electrically connected to an electrode of the organic light-emitting diode OLED, and the gate electrode electrically connected to the first node N1. Thus, the second switching element DT can adjust a driving current supplied to the organic light-emitting diode OLED based on a voltage applied to the gate electrode.

The organic light-emitting diode OLED may emit light of a predetermined color based on the driving current. Here, the predetermined color may be one of red, green, and blue in an exemplary embodiment. The first subpixel SPX1' may emit red light as described above with reference to FIG. 1. Thus, the organic light-emitting diode OLED of the first subpixel SPX1' may include a low or high molecular organic material corresponding to red.

The first subpixel SPX1' is not limited to the one illustrated in FIG. 3. According to the exemplary embodiments, the first subpixel SPX1' may include a plurality of switching elements for compensating for a threshold voltage of the second switching element DT, in addition to the first switching element ST and the second switching element DT. In the present specification, the display device according to the exemplary embodiment will be described as an LCD.

The arrangement of plurality of pixels will now be described based on first through fourth pixels PX1, PX2, PX3, and PX4 illustrated in FIGS. 4A and 4B.

Figure 4A:
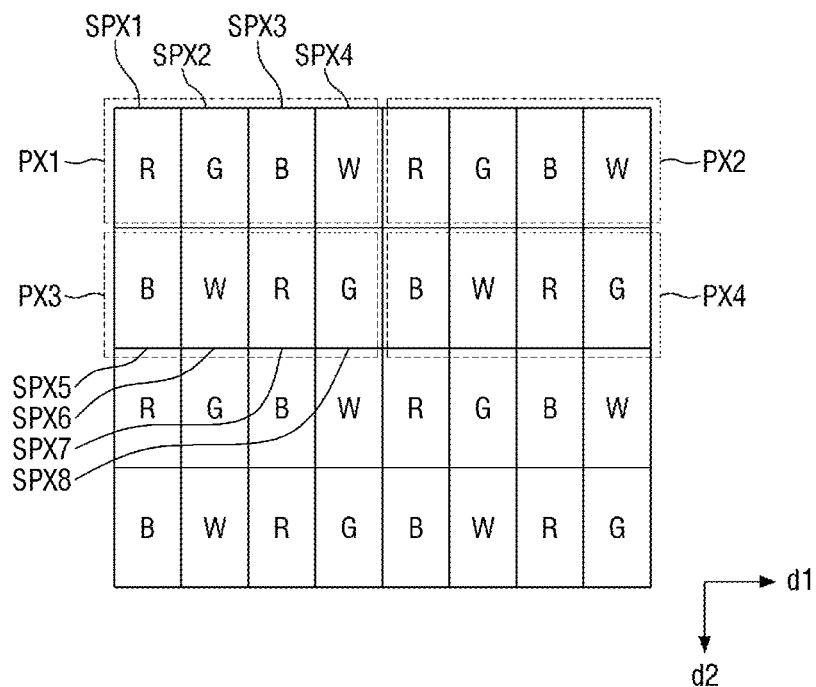
FIG. 4A and FIG. 4B illustrate exemplary arrangements of a plurality of pixels of the display device according to the exemplary embodiment.
Figure 4B:
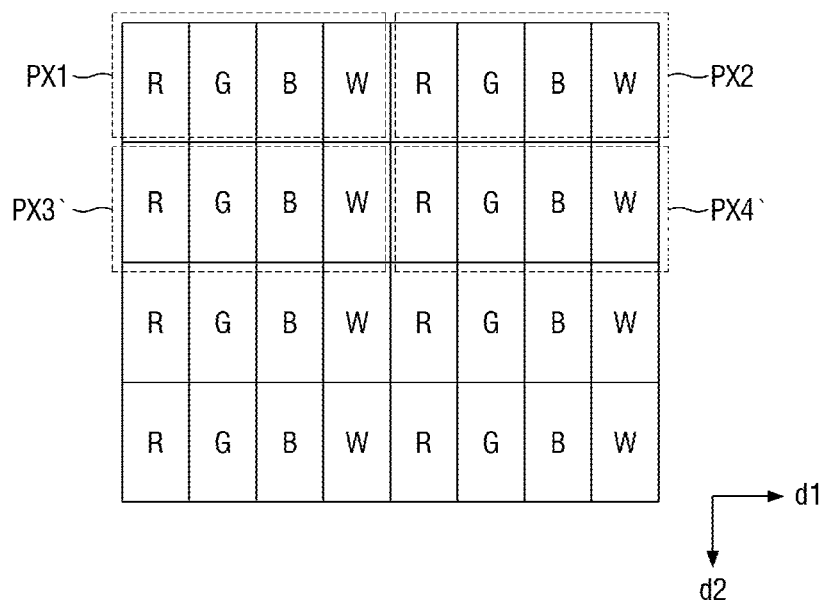

FIGS. 4A and 4B illustrate the arrangement of a plurality of pixels of the display device according to the exemplary embodiment. For ease of description, it is assumed that the first pixel PX1 illustrated in FIGS. 4A and 4B is the same as the first pixel PX1 illustrated in FIG. 1.

Referring to FIG. 4A, each of the first through fourth pixels PX1, PX2, PX3, and PX4 may include at least four subpixels that display different colors. In the exemplary embodiment, the subpixels may display red, green, blue, and white, respectively.

The arrangement of subpixels included in each pixel may be different. In the exemplary embodiment, the plurality of pixels disposed in the same row may have the same arrangement of subpixels. For example, subpixels included in the first pixel PX1 and the second pixel PX2 disposed in the same row as may be arranged in the same manner as the first pixel PX1. The subpixels included in the third pixel PX3 and the fourth pixel PX4 disposed in the same row as may be arranged in the same manner as the third pixel PX3.

The third pixel PX3 may include fifth through eighth subpixels SPX5, SPX6, SPX7, and SPX8 which display blue, white, red, and green, respectively. The first through fourth subpixels SPX1, SPX2, SPX3, and SPX4 included in the first pixel PX1 and the fifth through eighth subpixels SPX5, SPX6, SPX7, and SPX8 included in the third pixel PX3 may display different colors from each other along the column direction.

That is, the arrangement of subpixels may have a predetermined cycle along the second direction d2, that is, the column direction. For example, in the case of a column in which the first subpixel SPX1 is disposed, pixels that display red and blue may be sequentially arranged. Also, in the case of a column in which the second subpixel SPX2 is disposed, pixels that display green and white may be sequentially arranged.

In another exemplary embodiment, subpixels may display the same color along the column direction. Referring to FIG. 4B, the first pixel PX1 and a third pixel PX3' disposed in a different row from the first pixel PX1 may display the same color along the column direction.

The display colors and arrangement of a plurality of subpixels are not limited to those illustrated in FIGS. 4A and 4B. For example, the subpixels may also display cyan, magenta, and yellow. In addition, the subpixels may be applied to a horizontal pixel structure (i.e., a structure in which a pixel electrode has a horizontal length greater than its vertical length).

In the present specification, a case where a plurality of pixels included in the display unit 100 are arranged as illustrated in FIG. 4A will be described as an example.

Figure 5:
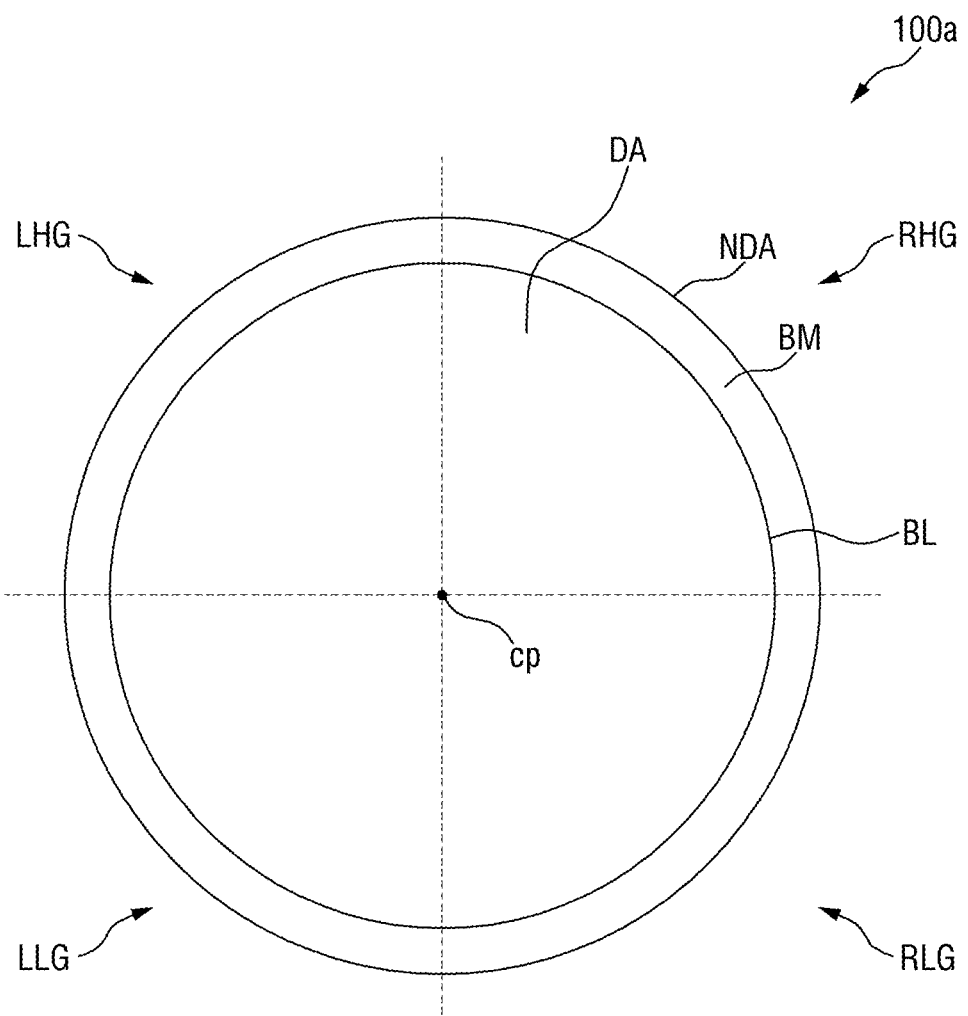
FIG. 5 is a schematic plan view of an exemplary embodiment of a display unit illustrated in FIG. 1.

FIG. 5 is a schematic plan view of an exemplary embodiment of the display unit 100 illustrated in FIG. 1. In FIG. 5, the display unit 100 is indicated by reference character 100a.

The display unit 100a may include a display area DA and a peripheral area NDA.

The display area DA is defined as an area in which an image is displayed. The display area DA may have a generally round shape in an exemplary embodiment. Here, examples of the round shape may include a circular shape, an elliptical shape, and a substantially circular shape. The peripheral area NDA is defined as an area in which a black matrix BM is disposed. Here, the black matrix BM refers to a black matrix disposed in the peripheral area NDA, and excludes the black matrix overlapping circuit elements disposed in the display area DA. The peripheral area NDA may surround the display area DA in an exemplary embodiment. Accordingly, the peripheral area NDA may have a round shape corresponding to the shape of the display area DA.

The display area DA may be divided into an upper left area LHG, an upper right area RHG, a lower left area LLG and a lower right area RLG with respect to an imaginary horizontal center line and an imaginary vertical center line crossing at an imaginary center point cp. An imaginary boundary line BL may separate the display area DA and the peripheral area NDA by overlapping at least a part of the pixels and the black matrix BM. That is, in the display device according to the exemplary embodiment, an area for displaying a color may be located not only in the display area DA but also in part of the peripheral area NDA. This will be described later.

According to the exemplary embodiments, the peripheral area NDA can have a quadrilateral shape. In addition, the shape of the display area DA can be different from the shape of the peripheral area NDA.

Figure 6:
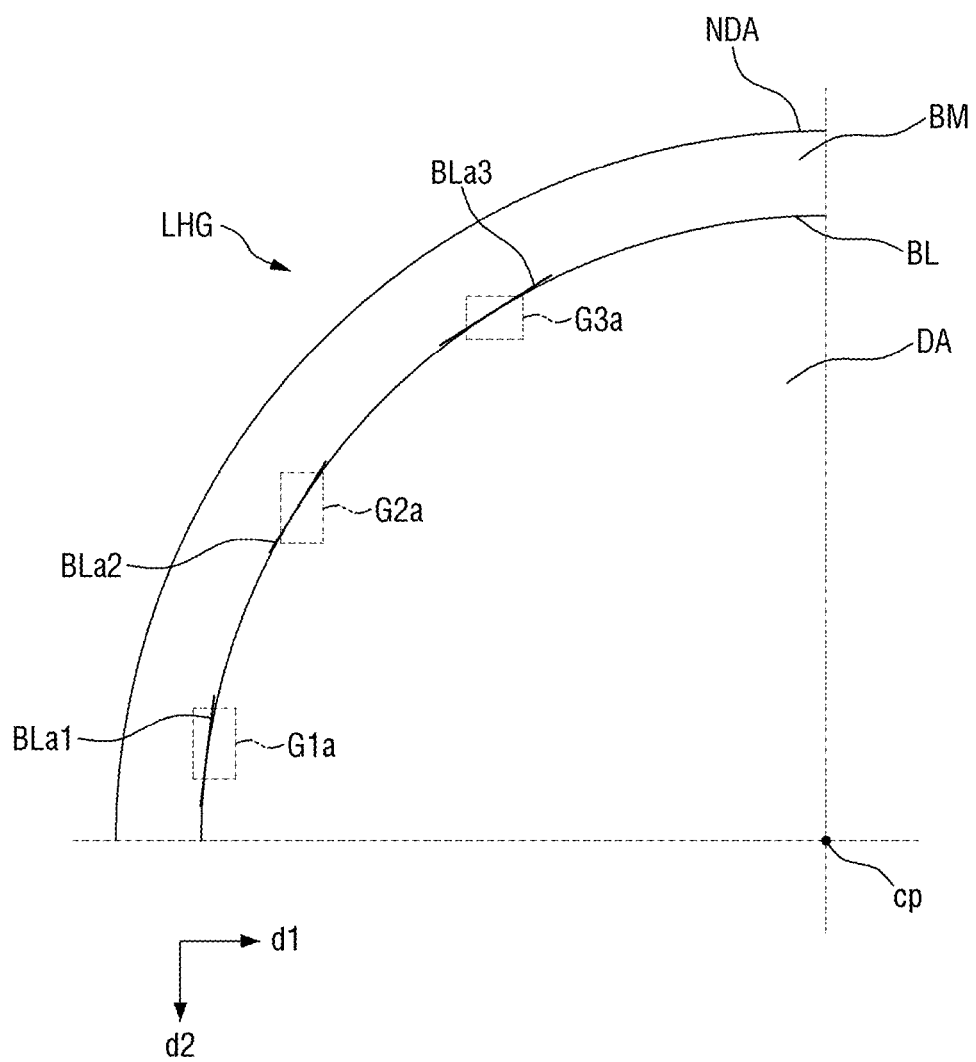
FIG. 6 is an enlarged view of an upper left area illustrated in FIG. 5.

FIG. 6 is an enlarged view of the upper left area LHG illustrated in FIG. 5.

Referring to FIG. 6, the upper left area LHG may include first through third areas G1a, G2a, and G3a. The first through third areas G1a, G2a, and G3a are defined as areas arranged sequentially along the first direction d1 and overlapping the imaginary boundary line BL.

Hereinafter, a slope refers to an absolute value of the slope. In other words, a slope of a tangent line to the imaginary boundary line BL refers to the absolute value of the slope of the tangent line to the imaginary boundary line BL, and a slope of the boundary lines between the pixels and the black matrix BM refers to the absolute value of the slope of the boundary lines between the pixels and the black matrix BM.

The slope of a tangent line to the imaginary boundary line BL may be different in each of the first through third areas G1a, G2a, and G3a. More specifically, the slope of the tangent line to the imaginary boundary line BL decreases along the first direction d1. This will be described using the first through third areas G1a, G2a, and G3a as an example.

A slope BLa2 of a tangent line to the imaginary boundary line BL located in the second area G2a is smaller than a slope BLa1 of a tangent line to the imaginary boundary line BL located in the first area G1a. A slope BLa3 of a tangent line to the imaginary boundary line BL located in the third area G3a is smaller than the slope BLa2 of the tangent line to the imaginary boundary line BL located in the second area G2a.

Hereinafter, the slope of the tangent line to the imaginary boundary line BL located in the first area G1a will be defined as a first tangent slope BLa1. The slope of the tangent line to the imaginary boundary line BL located in the second area G2a will be defined as a second tangent slope BLa2, and the slope of the tangent line to the imaginary boundary line BL located in the third area G3a will be defined as a third tangent slope BLa3. In other words, the first through third tangent slopes BLa1, BLa2, BLa3, the first tangent slope BLa1 is the greatest, and the third tangent slope BLa3 is the smallest.

The positions of the first through third areas G1a, G2a, and G3a are an exemplary embodiment and are not limited to those illustrated in FIG. 6 as long as the relation of magnitude between the first through third tangent slopes BLa1, BLa2, BLa3 are satisfied.

The slopes of boundary lines between pixels disposed in the first through third areas G1a, G2a, and G3a and the black matrix BM will now be described in more detail with reference to FIGS. 7, 8, 9, 10, 11, and 12.

First, the first area G1a will be described with reference to FIGS. 7 and 8.

Figure 7:
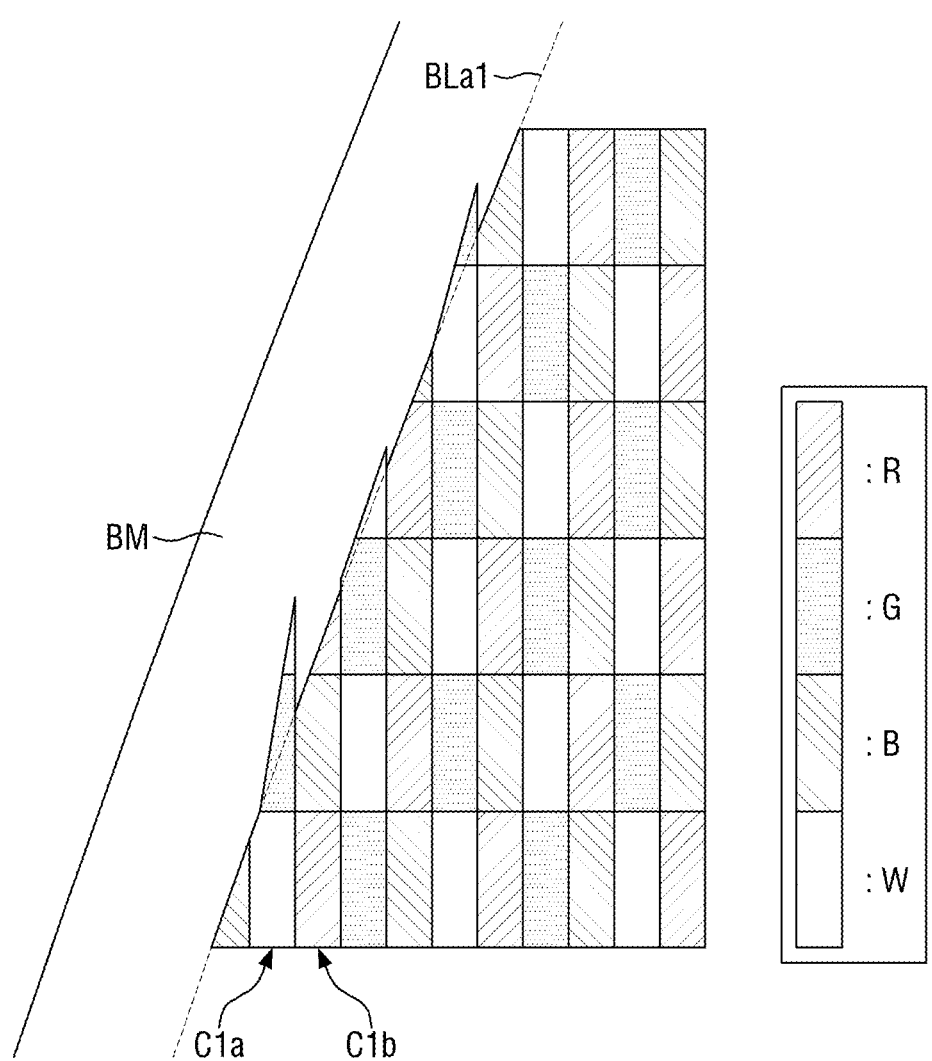
FIG. 7 is an enlarged view of a first area illustrated in FIG. 6.

FIG. 7 is an enlarged view of the first area G1a illustrated in FIG. 6. FIG. 8 is an enlarged view of a first column C1a and a second column C1b disposed in the first area G1a of FIG. 7.

The first column C1a is defined as a column, in which a green pixel G displaying green color and a white pixel W displaying white color are arranged, in the first area G1a. The second column C1b is defined as a column, in which a red pixel R displaying red color and a blue pixel B displaying blue color are arranged, in the first area G1a.

Figure 8:
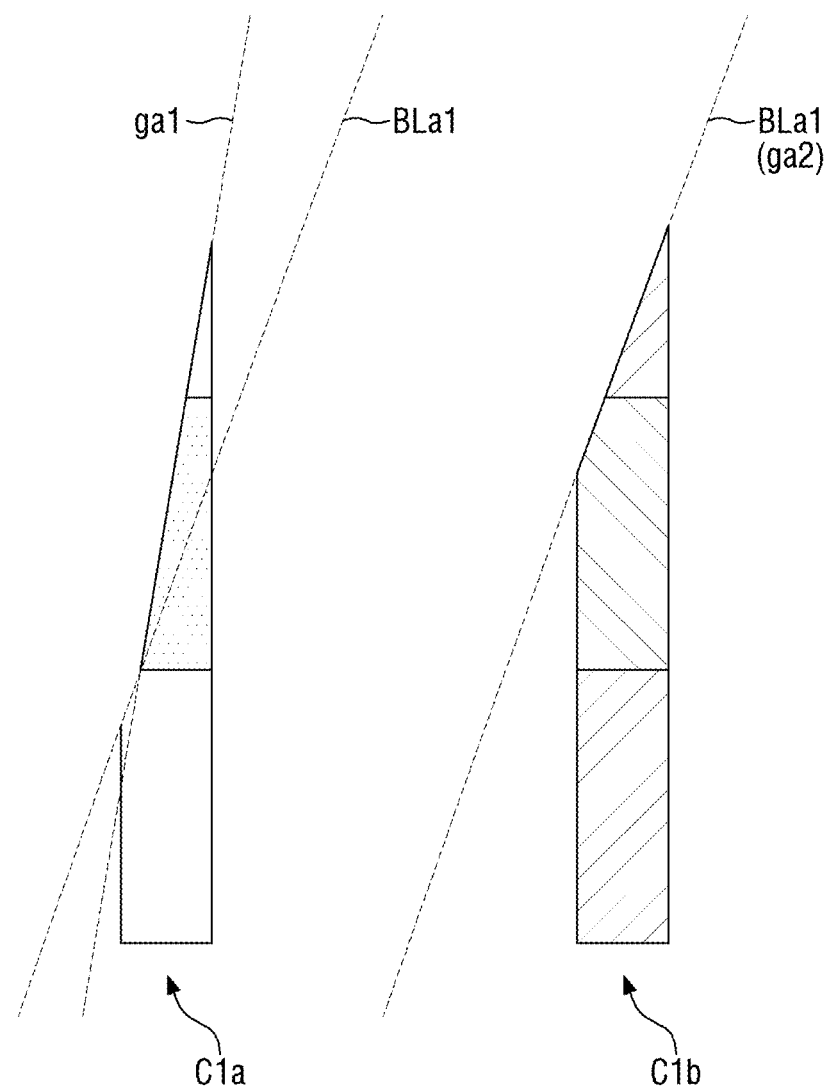
FIG. 8 is an enlarged view of a first column and a second column disposed in the first area of FIG. 7.

Referring to FIG. 8, a first boundary slope ga1 is defined as the slope of a boundary line between the first column C1a and the black matrix BM. A second boundary slope ga2 is defined as the slope of a boundary line between the second column C1b and the black matrix BM. Here, the first boundary slope ga1 is greater than the second boundary slope ga2. In addition, the first boundary slope ga1 is greater than the first tangent slope BLa1. On the other hand, the second boundary slope ga2 may be substantially equal to the first tangent slope BLa1. This means that at least one of the pixels disposed in the first column C1a includes an area not covered by the black matrix BM although the area is disposed in the peripheral area NDA beyond the imaginary boundary line BL (see FIG. 6). Here, the area not covered by the black matrix BM can also be expressed as an area not overlapping the black matrix BM. That is, at least part of an area of the first column C1a which overlaps the peripheral area NDA may not overlap the black matrix BM. Unlike in FIGS. 7 and 8, the second boundary slope ga2 can be smaller than the first tangent slope BLa1.

Next, the second area G2a will be described with reference to FIGS. 9 and 10.

Figure 9:
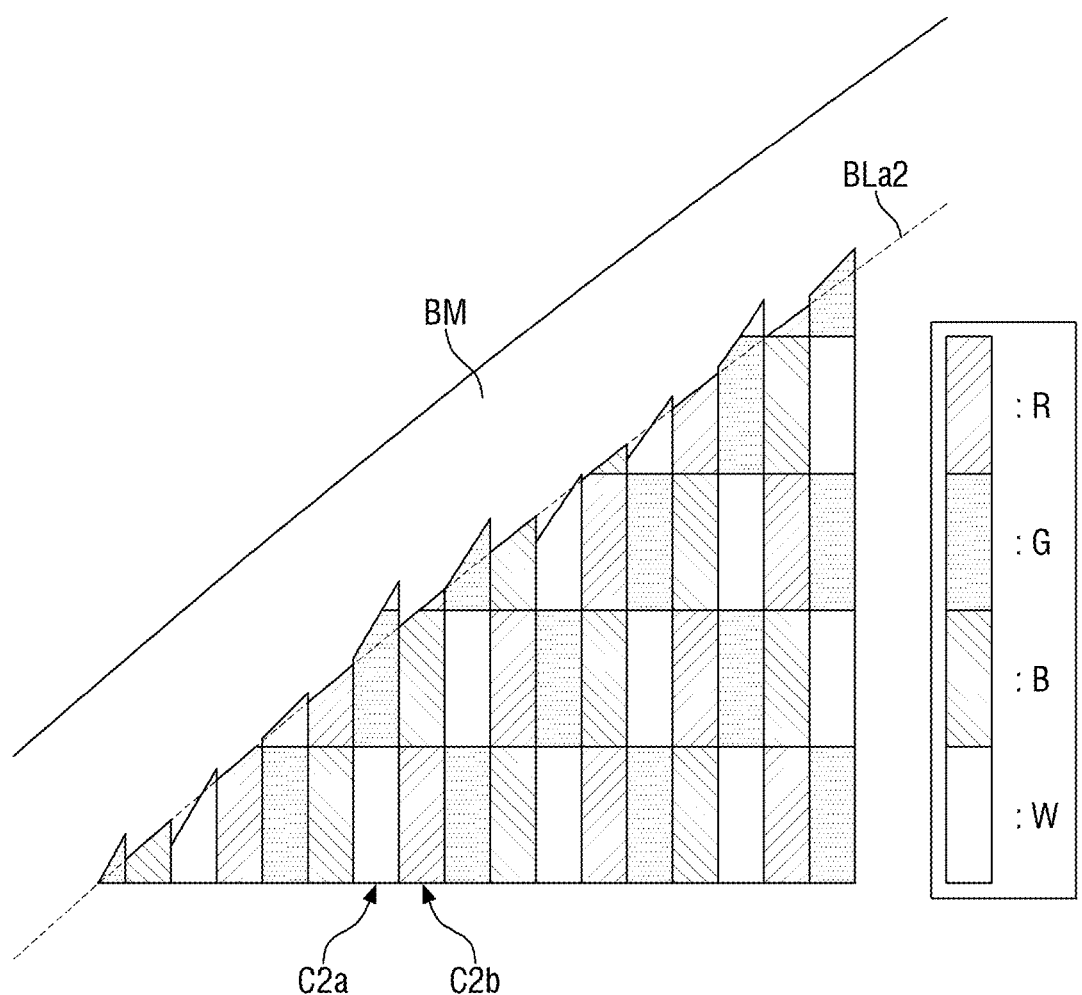
FIG. 9 is an enlarged view of a second area illustrated in FIG. 6.

FIG. 9 is an enlarged view of the second area G2a illustrated in FIG. 6. FIG. 10 is an enlarged view of a third column C2a and a fourth column C2b disposed in the second area G2a of FIG. 9.

The third column C2a is defined as a column, in which a green pixel G displaying green color and a white pixel W displaying white color are arranged, in the second area G2a. The fourth column C2b is defined as a column, in which a red pixel R displaying red color and a blue pixel B displaying blue color are arranged, in the second area G2a.

Figure 10:
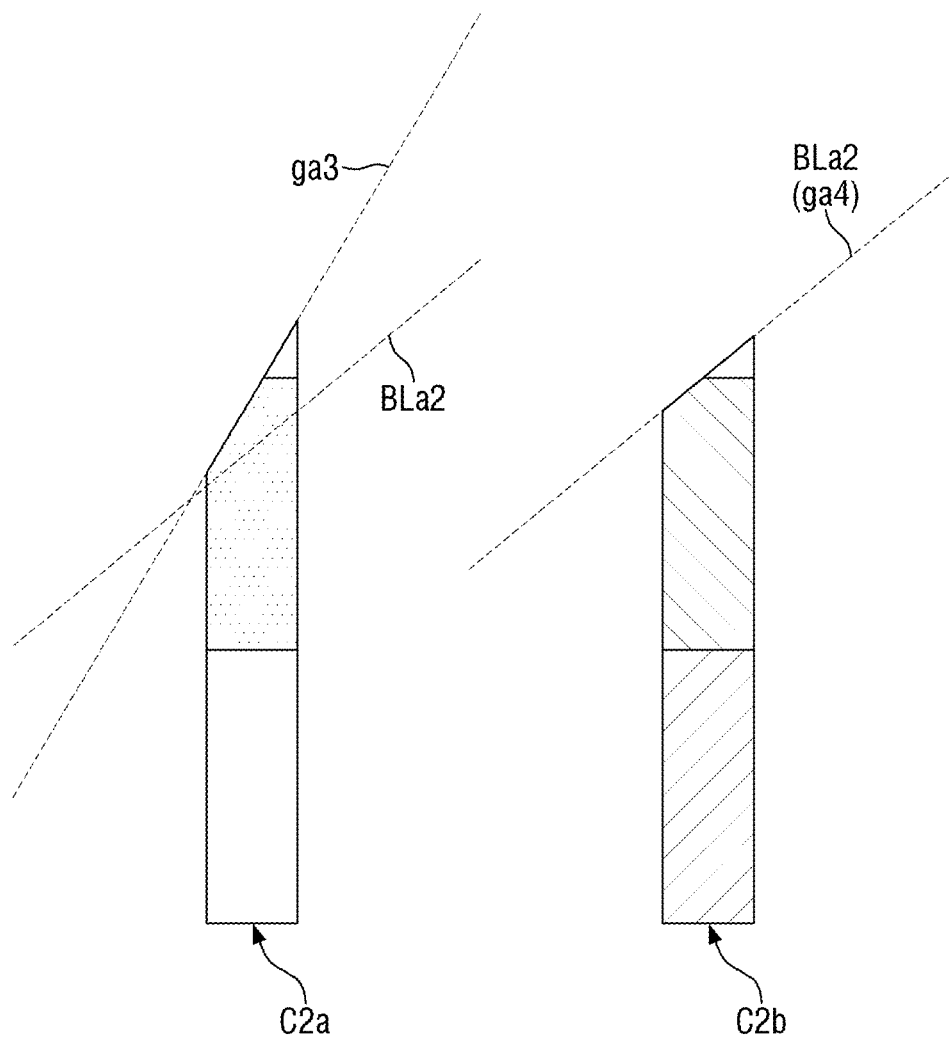
FIG. 10 is an enlarged view of a third column and a fourth column disposed in the second area of FIG. 9.

Referring to FIG. 10, a third boundary slope ga3 is defined as the slope of a boundary line between the third column C2a and the black matrix BM. A fourth boundary slope ga4 is defined as the slope of a boundary line between the fourth column C2b and the black matrix BM. Here, the third boundary slope ga3 is greater than the fourth boundary slope ga4. In addition, the third boundary slope ga3 is greater than the second tangent slope BLa2. On the other hand, the fourth boundary slope ga4 may be substantially equal to the second tangent slope BLa2. This means that at least one of the pixels disposed in the third column C2a includes an area not covered by the black matrix BM although the area is disposed in the peripheral area NDA beyond the imaginary boundary line BL (see FIG. 6). Unlike in FIGS. 9 and 10, the fourth boundary slope ga4 can be smaller than the first tangent slope BLa2.

Next, the third area G3a will be described with reference to FIGS. 11 and 12.

Figure 11:
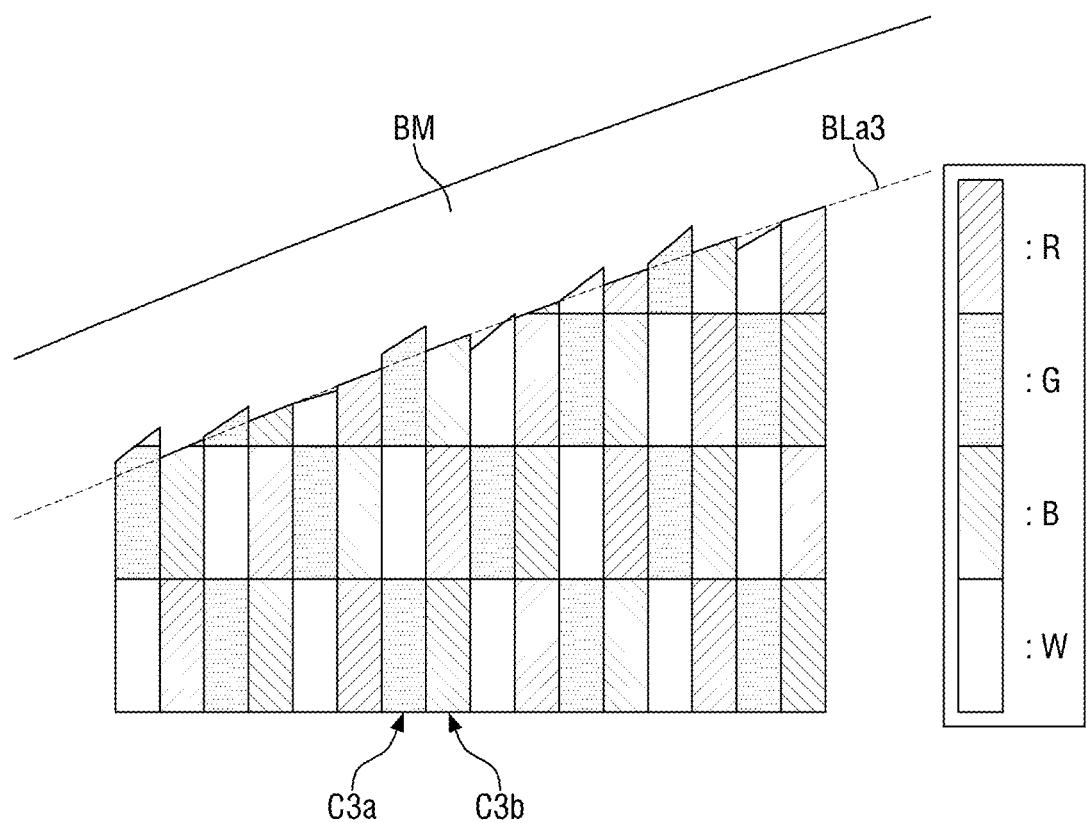
FIG. 11 is an enlarged view of a third area illustrated in FIG. 6.

FIG. 11 is an enlarged view of the third area G3a illustrated in FIG. 6. FIG. 12 is an enlarged view of a fifth column C3a and a sixth column C3b disposed in the third area G3a of FIG. 11.

The fifth column C3a is defined as a column, in which a green pixel G displaying green color and a white pixel W displaying white color are arranged, in the third area G3a. The sixth column C3b is defined as a column, in which a red pixel R displaying red color and a blue pixel B displaying blue color are arranged, in the third area G3a.

Figure 12:
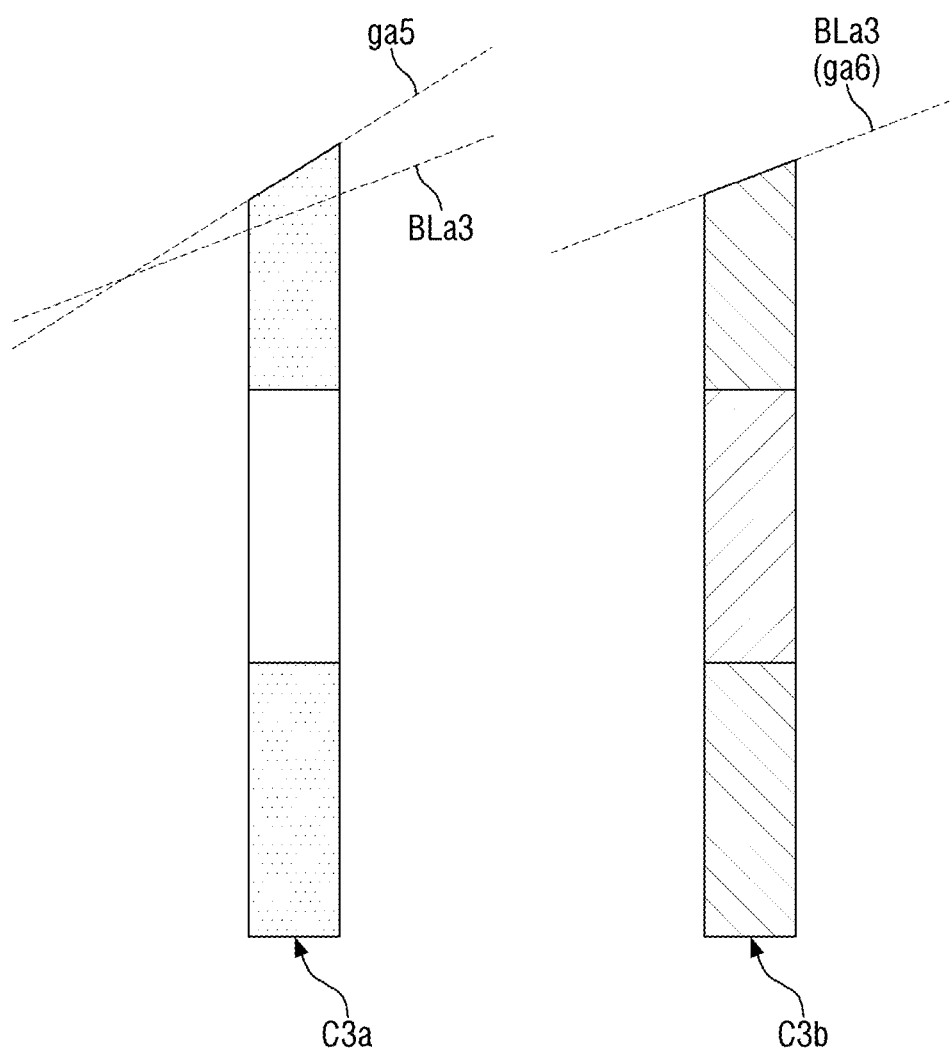
FIG. 12 is an enlarged view of a fifth column and a sixth column disposed in the third area of FIG. 11.

Referring to FIG. 12, a fifth boundary slope ga5 is defined as the slope of a boundary line between the fifth column C3a and the black matrix BM. A sixth boundary slope ga6 is defined as the slope of a boundary line between the sixth column C3b and the black matrix BM. Here, the fifth boundary slope ga5 is greater than the sixth boundary slope ga6. In addition, the fifth boundary slope ga5 is greater than the third tangent slope BLa3. On the other hand, the sixth boundary slope ga6 may be substantially equal to the third tangent slope BLa3. This means that at least one of the pixels disposed in the fifth column C3a includes an area not covered by the black matrix BM although the area is disposed in the peripheral area NDA beyond the imaginary boundary line BL (see FIG. 6). Unlike in FIGS. 11 and 12, the sixth boundary slope ga6 can be smaller than the third tangent slope BLa3.

According to a conventional display device having a circular display area, a aliasing effect may occur at a boundary between the display area and a peripheral area. Therefore, the circular shape of the display area may be perceived distorted by a user.

In the display device according to the exemplary embodiment, however, each pixel column may be formed to have a different boundary slope in consideration of the display color, the slope of a tangent line to the imaginary boundary line BL, and the contribution of each display color to luminance.

For example, each of the first column C1a, the third column C2a and the fifth column C3a may include at least one pixel which is disposed outside the display area DA (that is, disposed in the peripheral area NDA) based on the imaginary boundary line BL but is not completely covered by the black matrix BM. This at least one pixel disposed outside the display area DA and not covered by the black matrix BM may be a green pixel G or a white pixel W. That is, the display device according to the exemplary embodiment can realize an ideal cognitive curvature when perceived by the user by forming a boundary slope between a pixel column including a green pixel G displaying green color or a white pixel W displaying white color and the black matrix BM to be greater than a tangent slope. Therefore, the circular display area DA can be perceived with decreased distortion by the user.

Next, the upper right area RHG of the display area DA will be described.

Figure 13:
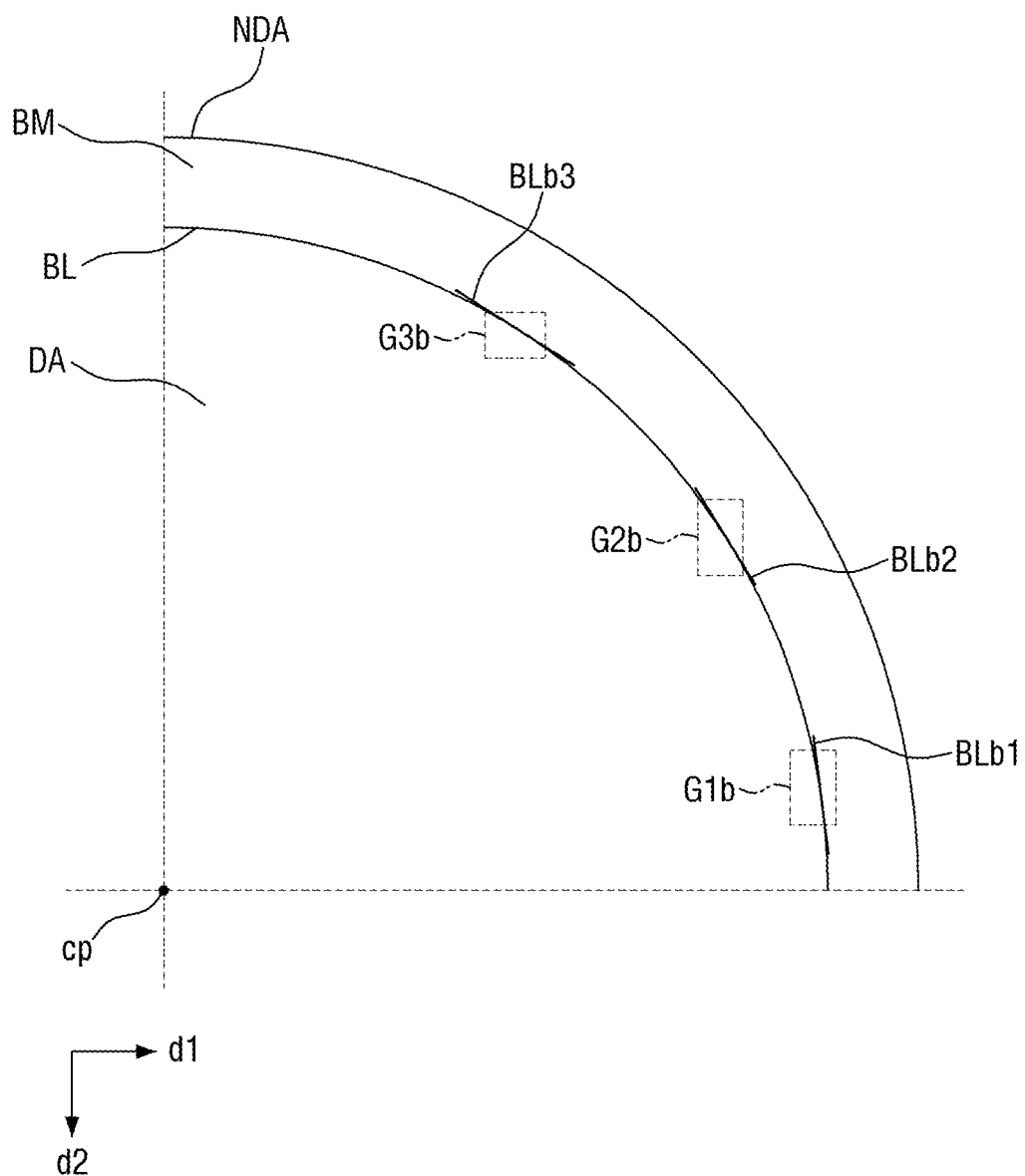
FIG. 13 is an enlarged view of an upper right area illustrated in FIG. 5.

FIG. 13 is an enlarged view of the upper right area RHG illustrated in FIG. 5. For simplicity, a description of elements and features identical to those described above with reference to FIGS. 1, 2, 3, 4, 5, 6, 7, 8, 9, 10, 11, and 12 will be omitted.

Referring to FIG. 13, the upper right area RHG may include fourth through sixth areas G1b, G2b, and G3b. The fourth through sixth areas G1b, G2b, and G3b are defined as areas arranged sequentially along a third direction d3 opposite to the first direction d1 and overlapping the imaginary boundary line BL.

The slope of a tangent line to the imaginary boundary line BL may be different in each of the fourth through sixth areas G1b, G2b, and G3b. More specifically, the slope of the tangent line to the imaginary boundary line BL decreases along the third direction d3.

Hereinafter, the slope of a tangent line to the imaginary boundary line BL located in the fourth area G1b will be defined as a fourth tangent slope BLb1. In addition, the slope of a tangent line to the imaginary boundary line BL located in the fifth area G2b will be defined as a fifth tangent slope BLb2, and the slope of a tangent line to the imaginary boundary line BL located in the sixth area G3b will be defined as a sixth normal tangent slope BLb3. Of the fourth through sixth tangent slopes BLb1, BLb2, and BLb3, the fourth tangent slope BLb1 is the greatest, and the sixth tangent slope BLb3 is the smallest.

The slopes of boundary lines between pixels disposed in the upper right area RHG and the black matrix BM may be substantially equal to the slopes of the boundary lines between the pixels disposed in the left upper area LHG and the black matrix BM. The slopes of the boundary lines between the pixels disposed in the upper right area RHG and the black matrix BM will now be described with reference to FIGS. 14, 15, 16, 17, 18, and 19. Here, a description of elements and features identical to those described above with reference to FIGS. 7, 8, 9, 10, 11, and 12 will be omitted.

Figure 14:
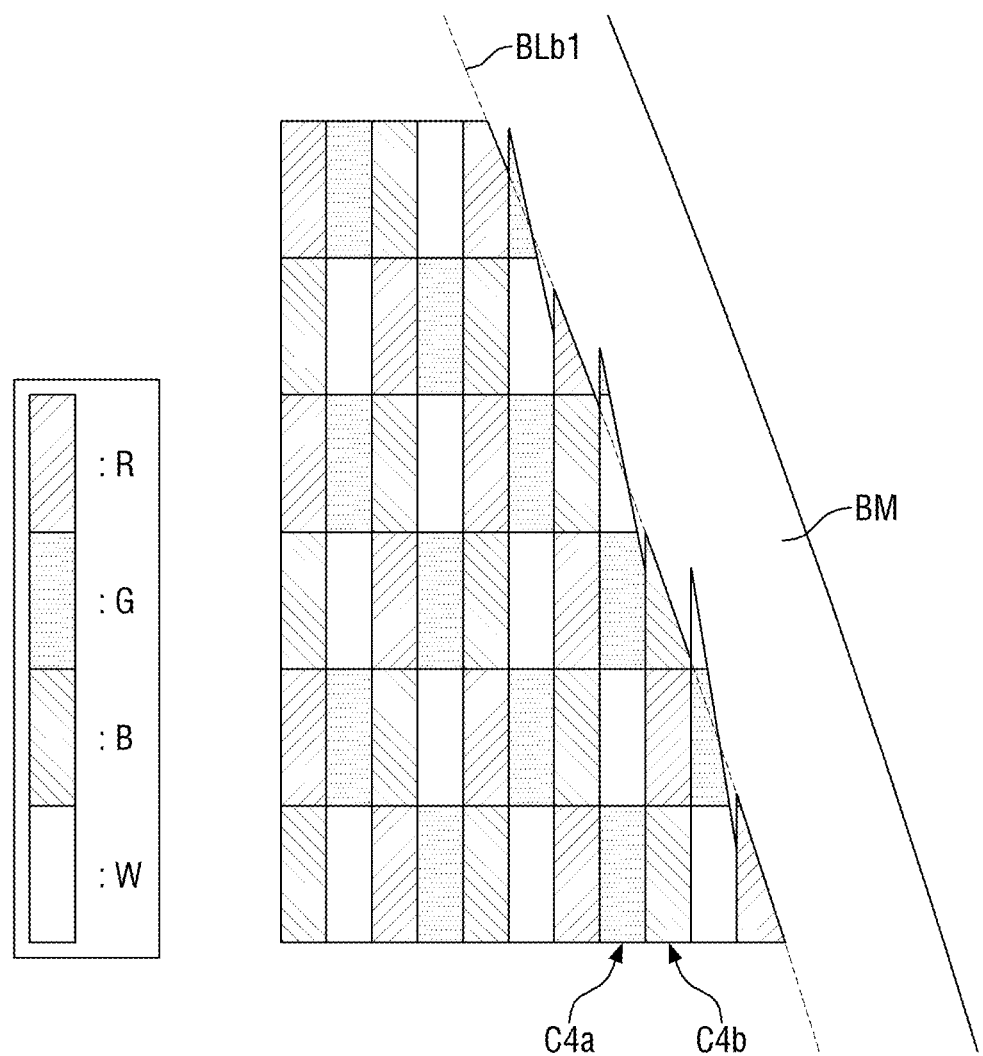
FIG. 14 is an enlarged view of a fourth area illustrated in FIG. 10.
Figure 15:
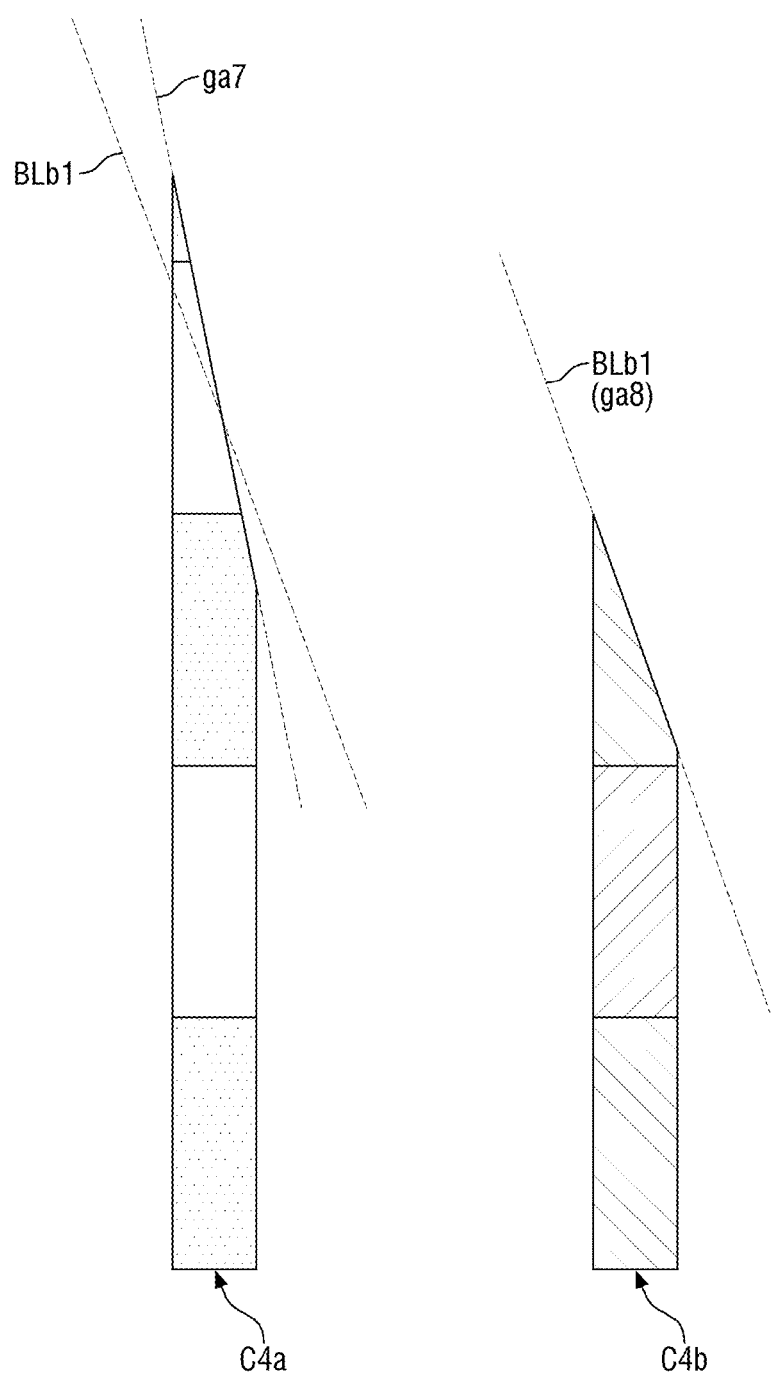
FIG. 15 is an enlarged view of a seventh column and an eighth column disposed in the fourth area of FIG. 14.

FIG. 14 is an enlarged view of the fourth area G1b illustrated in FIG. 10. FIG. 15 is an enlarged view of a seventh column C4a and an eighth column C4b disposed in the fourth area G1b of FIG. 14.

Referring to FIGS. 14 and 15, the seventh column C4a is defined as a column, in which a green pixel G displaying green color and a white pixel W displaying white color are arranged, in the fourth area G1b. The eighth column C4b is defined as a column, in which a red pixel R displaying red color and a blue pixel B displaying blue color are arranged, in the fourth area G1b.

Referring to FIG. 15, the seventh column C4a corresponds to the first column C1a disposed in the first area G1a. In addition, the eighth column C4b corresponds to the second column C1b disposed in the first area G1a.

Accordingly, a seventh boundary slope ga7 defined as the slope of a boundary line between the seventh column C4a and the black matrix BM is greater than an eighth boundary slope ga8 defined as the slope of a boundary line between the eighth column C4b and the black matrix BM. In addition, the seventh boundary slope ga7 is greater than the fourth tangent slope BLb1. On the other hand, the eighth boundary slope ga8 may be substantially equal to the fourth tangent slope BLb1.

Figure 16:
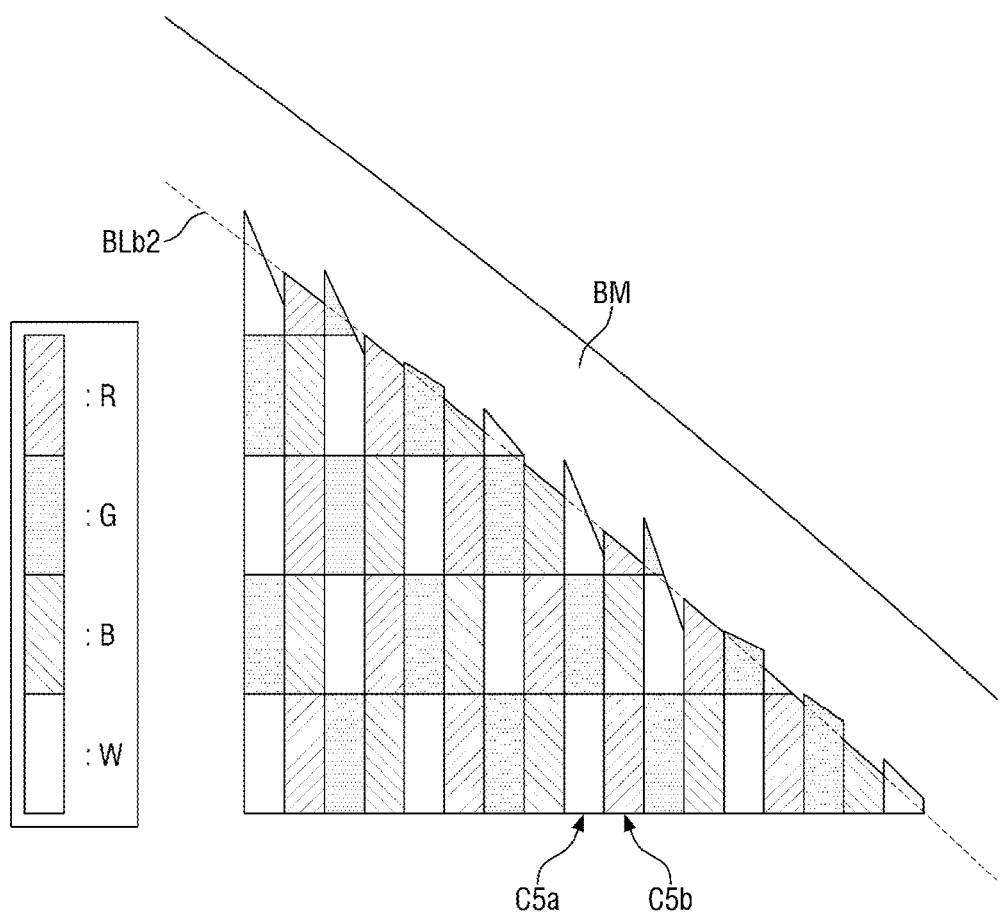
FIG. 16 is an enlarged view of a fifth area illustrated in FIG. 10.
Figure 17:
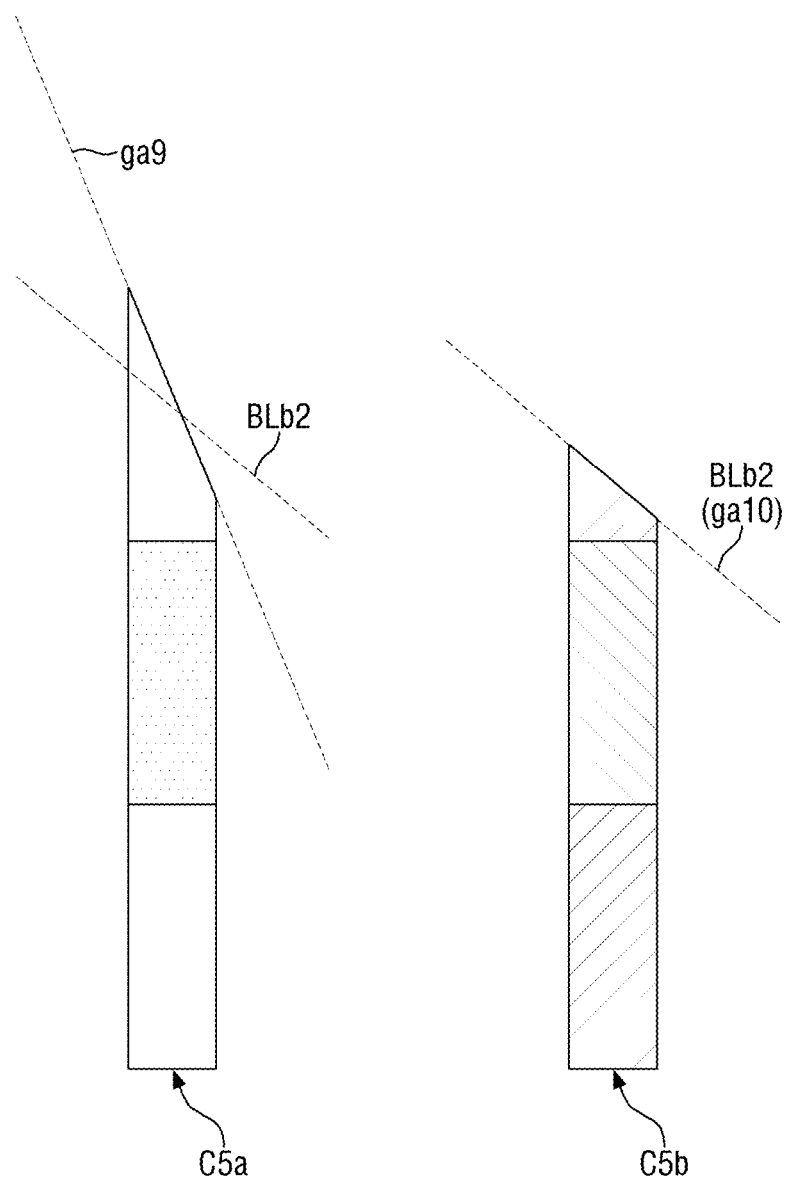
FIG. 17 is an enlarged view of a ninth column and a tenth column disposed in the fifth area of FIG. 16.

FIG. 16 is an enlarged view of the fifth area G2b illustrated in FIG. 10. FIG. 17 is an enlarged view of a ninth column C5a and a tenth column C5b disposed in the fifth area G2b of FIG. 16.

Referring to FIGS. 16 and 17, the ninth column C5a is defined as a column, in which a green pixel G displaying green color and a white pixel W displaying white color are arranged, in the fifth area G2b. The tenth column C5b is defined as a column, in which a red pixel R displaying red color and a blue pixel B displaying blue color are arranged, in the fifth area G2b.

Referring to FIG. 17, the ninth column C5a corresponds to the third column C2a disposed in the second area G2a. In addition, the tenth column C5b corresponds to the fourth column C2b disposed in the second area G2a.

Accordingly, a ninth boundary slope ga9 defined as the slope of a boundary line between the ninth column C5a and the black matrix BM is greater than a tenth boundary slope ga10 defined as the slope of a boundary line between the tenth column C5b and the black matrix BM. In addition, the ninth boundary slope ga9 is greater than the fifth tangent slope BLb2. On the other hand, the tenth boundary slope ga10 may be substantially equal to the fifth tangent slope BLb2.

Figure 18:
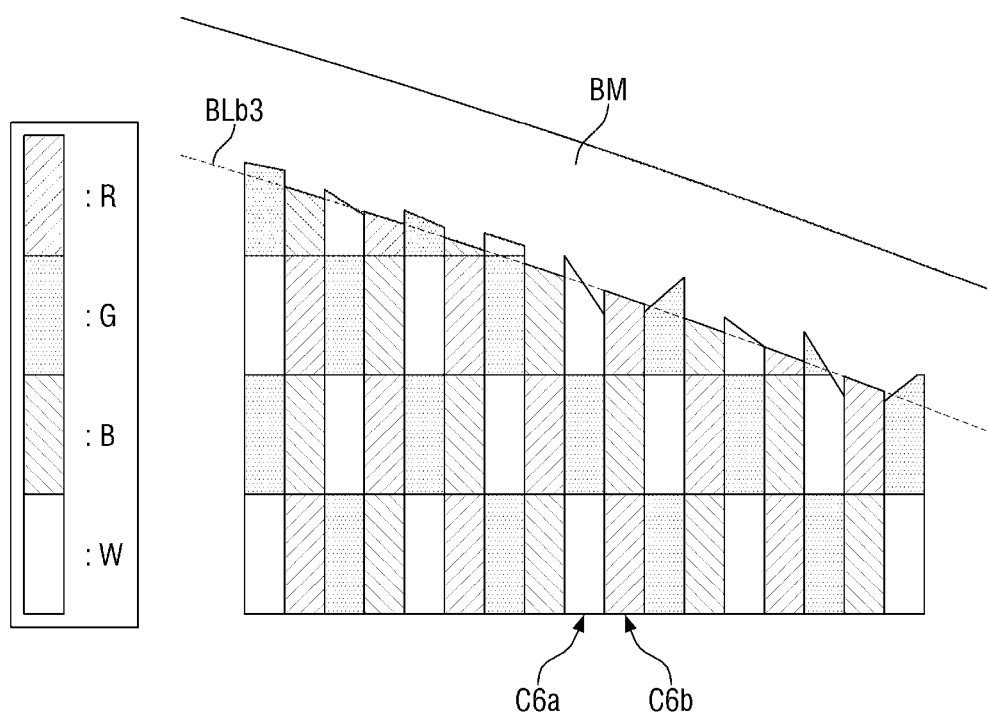
FIG. 18 is an enlarged view of a sixth area illustrated in FIG. 10.
Figure 19:
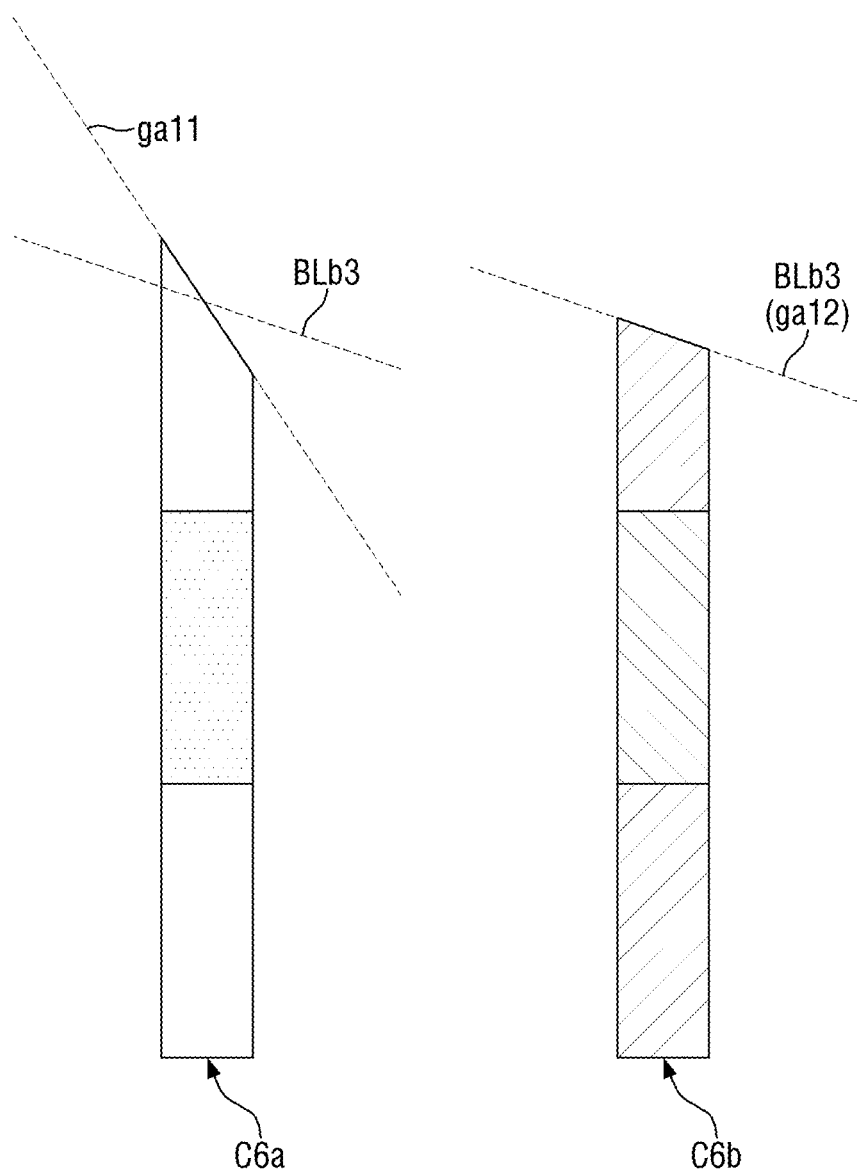
FIG. 19 is an enlarged view of an eleventh column and a twelfth column disposed in the sixth area of FIG. 18.

FIG. 18 is an enlarged view of the sixth area G3b illustrated in FIG. 10. FIG. 19 is an enlarged view of an eleventh column C6a and a twelfth column C6b disposed in the sixth area G3b of FIG. 18.

Referring to FIGS. 18 and 19, the eleventh column C6a is defined as a column, in which a green pixel G displaying green color and a white pixel W displaying white color are arranged, in the sixth area G3b. The twelfth column C6b is defined as a column, in which a red pixel R displaying red color and a blue pixel B displaying blue color are arranged, in the sixth area G3b.

Referring to FIG. 19, the eleventh column C6a corresponds to the fifth column C3a disposed in the third area G3a. In addition, the twelfth column C6b corresponds to the sixth column C3b disposed in the third area G3a.

Accordingly, an eleventh boundary slope ga11 defined as the slope of a boundary line between the eleventh column C6a and the black matrix BM is greater than a twelfth boundary slope ga12 defined as the slope of a boundary line between the twelfth column C6b and the black matrix BM. In addition, the eleventh boundary slope ga11 is greater than the sixth tangent slope BLb3. On the other hand, the twelfth boundary slope ga12 may be substantially equal to the sixth tangent slope BLb3.

That is, for example, each of the seventh column C4a, the ninth column C5a and the eleventh column C6a may include at least one pixel which is disposed outside the display area DA (that is, disposed in the peripheral area NDA) based on the imaginary boundary line BL but is not completely covered by the black matrix BM. This at least one pixel disposed outside the display area not covered by the black matrix BM may be a green pixel G or a white pixel W. That is, the display device according to the exemplary embodiment can realize an ideal cognitive curvature when perceived by the user by forming a boundary slope between a pixel column including a green pixel G displaying green color or a white pixel W displaying white color and the black matrix BM to be greater than a tangent slope. Accordingly, a distortion in a perceived boundary line of the display may be reduced.

According to the exemplary embodiments, the arrangement structure and shapes of pixel columns in the lower left area LLG may be symmetrical to the respective pixel columns in the upper left area LHG with respect to the imaginary horizontal center line crossing the imaginary center point CP (refer to FIG. 5). In addition, the arrangement structure and shapes of pixel columns in the lower right area RLG may be symmetrical to the respective pixel columns in the upper right area RHG in with respect to the imaginary horizontal center line crossing the imaginary center point CP (refer to FIG. 5).

Figure 20A:
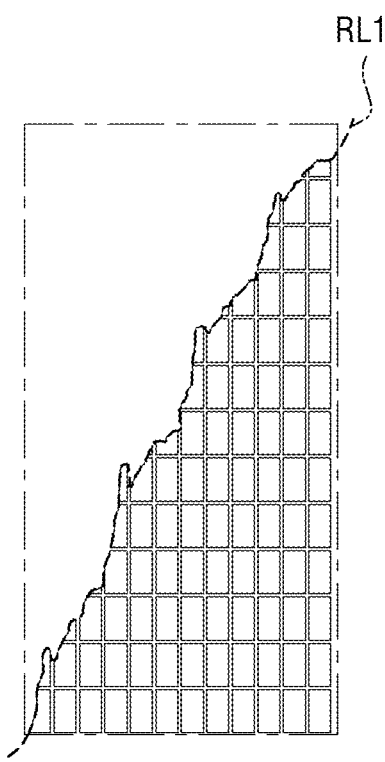
FIG. 20A illustrates an actual boundary line of one area of the upper left area of the display device according to the exemplary embodiment.
Figure 20B:
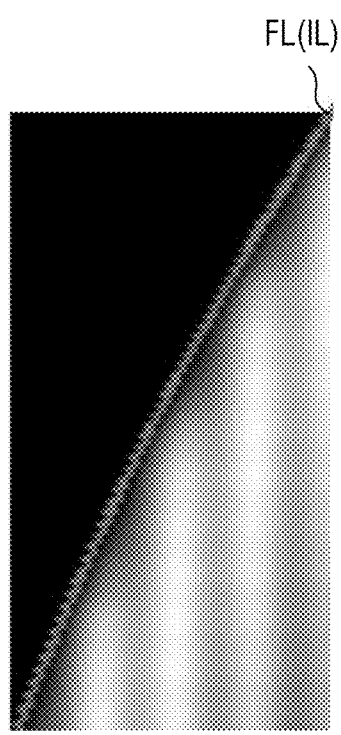
FIG. 20B illustrates a perceived boundary line of one area of the upper left area of the display device according to the exemplary embodiment.
Figure 21A:
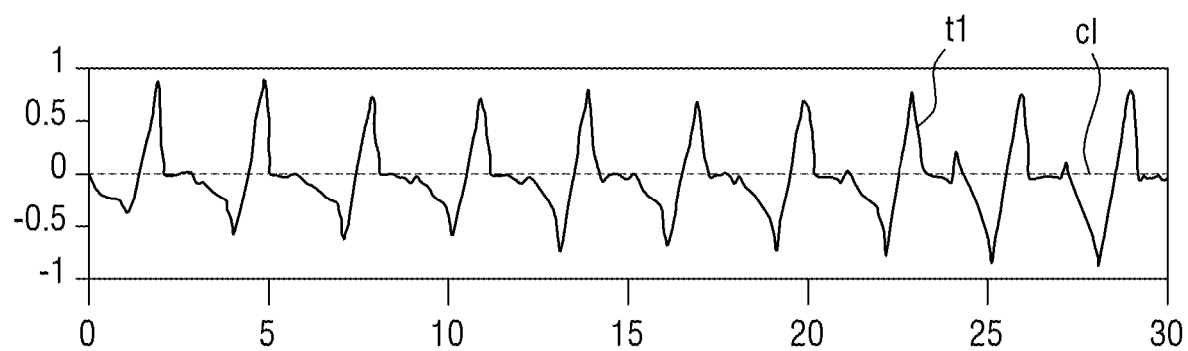
FIG. 21A is a graph illustrating a luminance error at the actual boundary line of FIG. 20A.
Figure 21B:
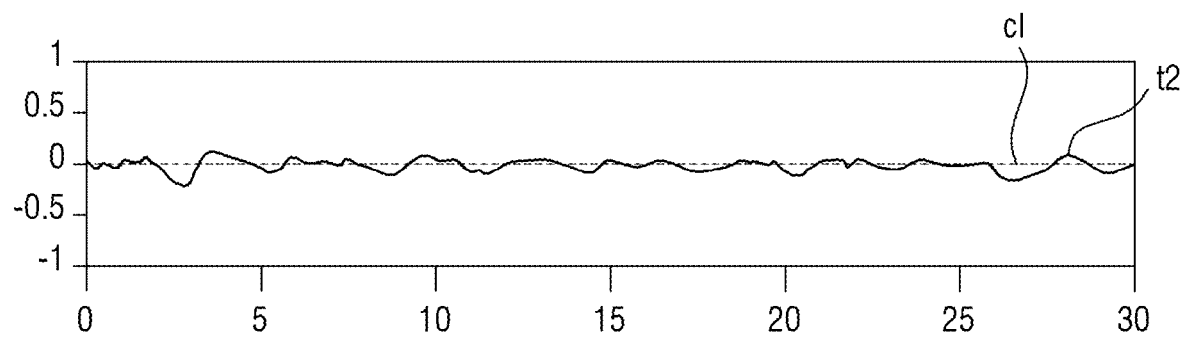
FIG. 21B is a graph illustrating a luminance error at the perceived boundary line of FIG. 20B.

FIG. 20A illustrates an actual boundary line RL1 of one area of the upper left area LHG of the display device according to the exemplary embodiment. FIG. 20B illustrates a perceived boundary line FL of one area of the upper left area of the display device according to the exemplary embodiment. FIG. 21A is a graph illustrating a luminance error at the actual boundary line RL1 of FIG. 20A. FIG. 21B is a graph illustrating a luminance error at the perceived boundary line FL of FIG. 20B. Here, the luminance error is a value indicating the degree of deviation from a boundary line c1 having an ideal curvature.

Referring to FIG. 20A, the actual boundary line RL1 of the display device according to the exemplary embodiment does not satisfy the ideal curvature of the circular display area DA (see FIG. 5) as described above. Referring to FIG. 21A, the degree of deviation of the actual boundary line RL1 or t1 in FIG. 20A from the boundary line c1 having the ideal curvature may be in the range of about −0.5 to +0.8.

On the other hand, the perceived boundary line FL of the display device according to the exemplary embodiment may be substantially the same as or close to an ideal cognitive curvature IL of the circular display area DA (see FIG. 5). Referring to FIG. 21B, the degree of deviation of the perceived boundary line FL or t2 in FIG. 20B from the boundary line c1 having the ideal curvature may be in the range of about −0.2 to +0.2.

That is, the display device according to the exemplary embodiment may have the perceived boundary line FL formed close to the boundary line c1 having the ideal curvature by forming the actual boundary line RL1 not to satisfy the ideal curvature. That is, by mitigating or reducing the aliasing effect and realizing the ideal cognitive curvature, the display device according to the exemplary embodiment enables a user to perceive the circular display area DA as being close to a circular shape with less distortion.

Figure 22A:
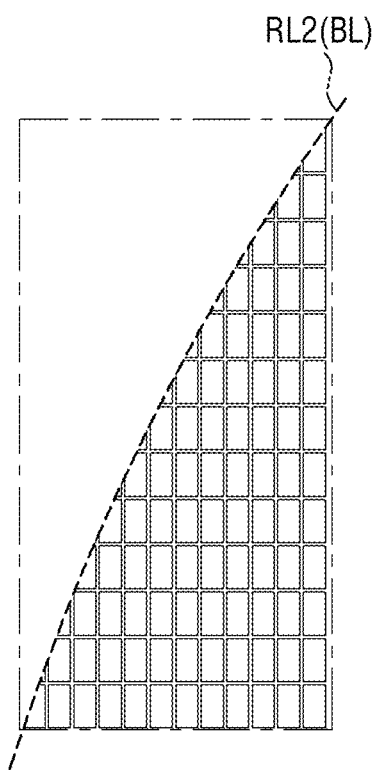
FIG. 22A illustrates an actual boundary line of one area of an upper left area of a conventional display device.
Figure 22B:
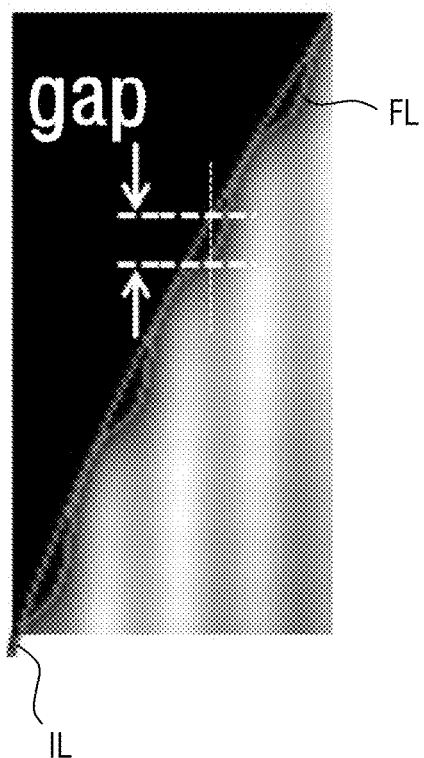
FIG. 22B illustrates a perceived boundary line of one area of an upper left area of a conventional display device.
Figure 23A:
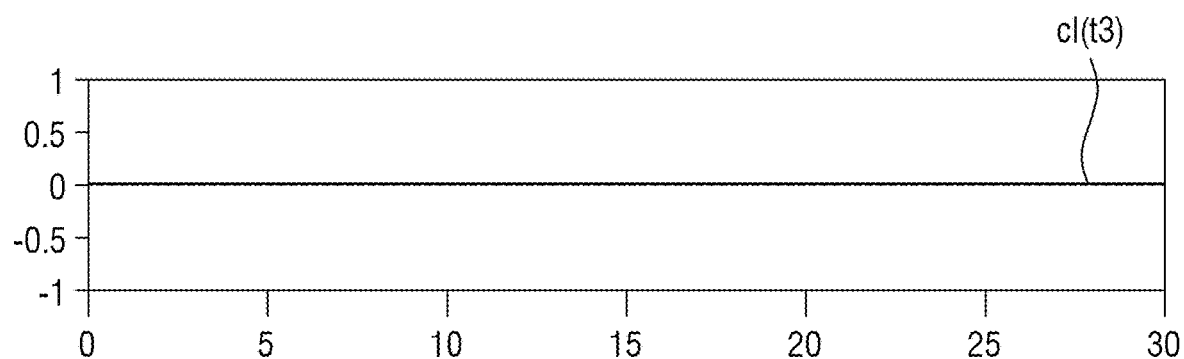
FIG. 23A is a graph illustrating a luminance error at the actual boundary line of FIG. 22A.
Figure 23B:
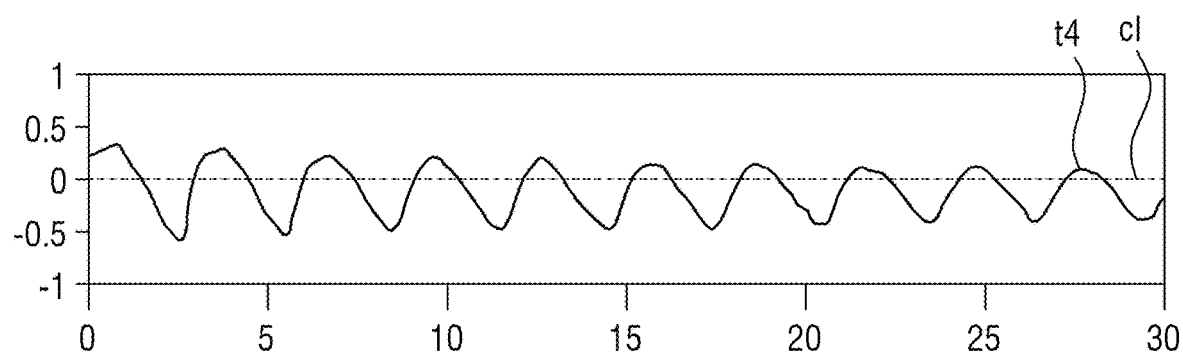
FIG. 23B is a perceived luminance error at the perceived boundary line of FIG. 22B.

FIG. 22A illustrates an actual boundary line RL2 of one area of an upper left area of a conventional display device. FIG. 22B illustrates a perceived boundary line FL of the one area of the upper left area of the display device of the conventional display device. FIG. 23A is a graph illustrating a luminance error at the actual boundary line RL2 of FIG. 22A. FIG. 23B is a graph illustrating a luminance error at the perceived boundary line FL of FIG. 22B. For simplicity, a description of elements and features identical to those described above with reference to FIGS. 20 and 21 will be omitted.

Referring to FIG. 22A, the actual boundary line RL2 of the conventional display device may be the same as an ideal curvature IL of a circular display area. Referring to FIG. 23A, the actual boundary line RL2 or t3 in FIG. 22A may be substantially the same as or close to a boundary line c1 having an ideal curvature.

On the other hand, the perceived boundary line FL of the conventional display device has a certain gap from the ideal cognitive curvature IL of the circular display area. Referring to FIG. 23B, the degree of deviation of the perceived boundary line FL or t4 in FIG. 22B from the boundary line c1 having the ideal curvature may be in the range of about −0.6 to +0.4. This means that although the display area is circular, a user may perceive the display area as not being circular.

Figure 24:
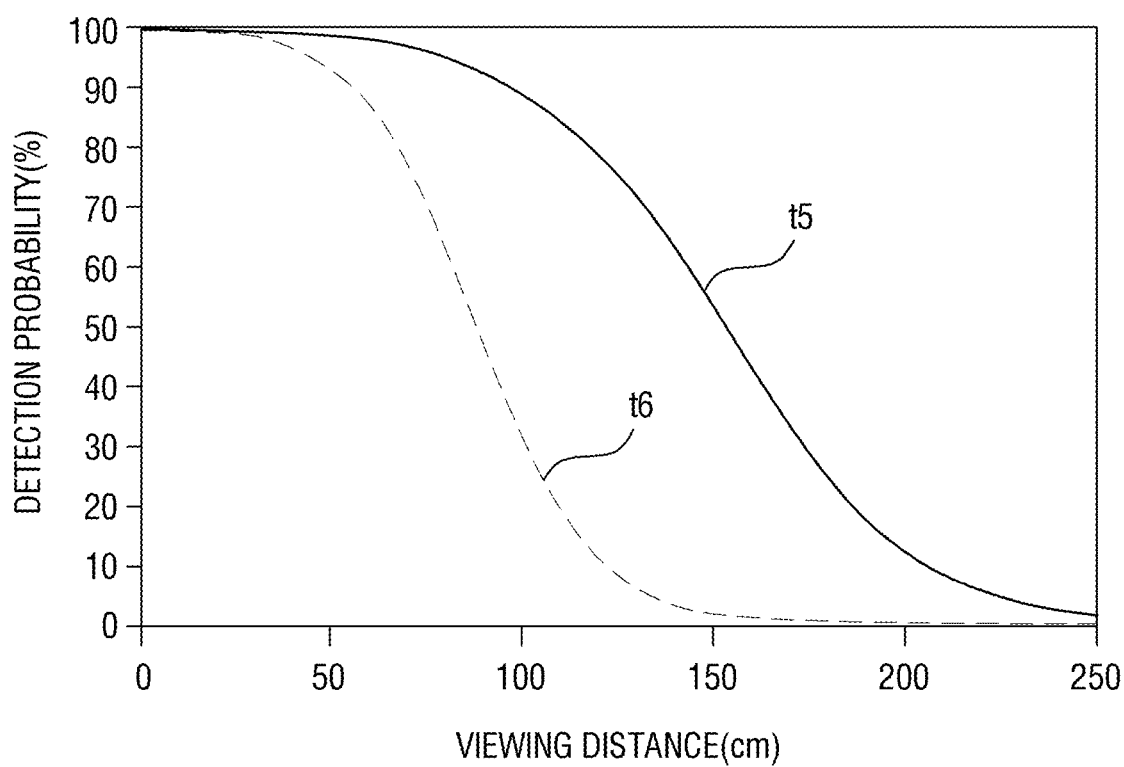
FIG. 24 is a graph illustrating the probability of aliasing effect detection with respect to the viewing distance in the display device according to the exemplary embodiment.

FIG. 24 is a graph illustrating the probability of aliasing effect detection with respect to the viewing distance in the display device according to the exemplary embodiment. In FIG. 24, t5 represents the conventional display device, and t6 represents the display device according to the exemplary embodiment.

Referring to FIG. 24, it can be seen that the probability of aliasing effect detection is lower in the display device t6 according to the exemplary embodiment than in the conventional display device t5 based on the same viewing distance. Table 1 below shows the results of experiments on aliasing effect non-perception distances of the display device according to the exemplary embodiment and the conventional display device. Here, the graph of FIG. 24 and Table 1 show the results of experiments conducted based on a 55-inch UHD TV.

TABLE 1

|  | Conventional display device | Exemplary display device | Improvement rate |
|---|---|---|---|
| Left | 111 cm | 75 cm | 32% |
| Right | 152 cm | 88 cm | 42% |

Referring to Table 1, the aliasing effect non-perception distance of the display device according to the exemplary embodiment is 75 cm in the case of a left side and 88 cm in the case of a right side. On the other hand, the aliasing effect non-perception distance of the conventional display device is 111 cm in the case of the left side and 152 cm in the case of the right side. This indicates that the aliasing effect is less likely to be perceived in the display device according to the exemplary embodiment than in the conventional display device.

According to the exemplary embodiments, the display device may have reduced aliasing effect. Accordingly, the display device can be perceived as being closer to a circular shape by a user.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display area;
a peripheral area which is located outside the display area and in which a black matrix is disposed; and
a plurality of pixel columns comprising:
a first pixel column comprising a first pixel configured to display a first color; and
a second pixel column comprising a second pixel configured to display a second color different from the first color,
wherein an absolute value of a first boundary slope of a boundary line between the first pixel column and the black matrix is greater than an absolute value of a second boundary slope of a boundary line between the second pixel column and the black matrix,
wherein the first color is one of white and green,
wherein a part of the first pixel column disposed in the peripheral area overlaps the black matrix and is not completely covered by the black matrix, and
wherein a part of the second pixel column disposed in the peripheral area completely overlaps the black matrix.

2. The display device of claim 1, wherein the first pixel column further comprises a third pixel configured to display a third color, and
wherein the third color is one of white and green and different from the first color.

3. The display device of claim 1, wherein the second color is red.

4. The display device of claim 3, wherein the second pixel column further comprises a fourth pixel configured to display a fourth color, and
wherein the fourth color is blue.

5. The display device of claim 1, wherein the display area and the peripheral area are separated by an imaginary boundary line, and an absolute value of a slope of a tangent line at which the first pixel column and the imaginary boundary line meet is smaller than the absolute value of the first boundary slope.

6. The display device of claim 1, wherein the display area and the peripheral area are separated by the imaginary boundary line, and an absolute value of a slope of a tangent line at which the second pixel column and the imaginary boundary line meet is greater than or equal to the absolute value of the second boundary slope.

7. The display device of claim 1, wherein the display area is circular.

8. A display device comprising:
a display area;
a peripheral area disposed outside the display area and separated from the display area by an imaginary boundary line;
a black matrix disposed in the peripheral area; and
a plurality of pixel columns comprising:
a first pixel column comprising a first pixel configured to display a first color; and
a second pixel column comprising a second pixel configured to display a second color different from the first color,
wherein an absolute value of a first boundary slope of a boundary line between the first pixel column and the black matrix is greater than an absolute value of a second boundary slope of a boundary line between the second pixel column and the black matrix,
wherein an absolute value of a slope of a tangent line at which the first pixel column and the imaginary boundary line meet is smaller than the first boundary slope,
wherein a part of the first pixel column disposed in the peripheral area overlaps the black matrix and is not completely covered by the black matrix, and
wherein a part of the second pixel column disposed in the peripheral area completely overlaps the black matrix.

9. The display device of claim 8, wherein an absolute value of a slope of a tangent line at which the second pixel column and the imaginary boundary line meet is greater than or equal to the absolute value of the second boundary slope.

10. The display device of claim 8, wherein the first color is one of white and green, and the second color is one of red and blue.

11. A display device comprising:
a display area;
a peripheral area disposed outside the display area and separated from the display area by an imaginary boundary line;
a black matrix disposed in the peripheral area; and
a plurality of pixel columns comprising:
a first pixel column comprising a first pixel configured to display a first color; and a second pixel column comprising a second pixel configured to display a second color different from the first color, wherein the first pixel of the first pixel column disposed in the peripheral area does not overlap the black matrix, wherein the first color is one of white and green, wherein a part of the first pixel column disposed in the peripheral area overlaps the black matrix and is not completely covered by the black matrix, and wherein a part of the second pixel column disposed in the peripheral area completely overlaps the black matrix.

12. The display device of claim 11, wherein the second color is one of blue and red.

13. The display device of claim 11, wherein an absolute value of a first boundary slope of a boundary line between the first pixel column and the black matrix is greater than an absolute value of a second boundary slope of a boundary line between the second pixel column and the black matrix.

14. The display device of claim 13, wherein an absolute value of a slope of a tangent line at which the first pixel column and the imaginary boundary line meet is smaller than the absolute value of the first boundary slope.

15. The display device of claim 13, wherein an absolute value of a slope of a tangent line at which the second pixel column and the imaginary boundary line meet is greater than the absolute value of or equal to the second boundary slope.

\* \* \* \* \*